United States Patent
Lin et al.

(10) Patent No.: US 9,472,672 B2
(45) Date of Patent: Oct. 18, 2016

(54) ELIMINATING FIN MISMATCH USING ISOLATION LAST

(71) Applicant: Taiwan Semiconductor Manufacturing Company, Ltd., Hsin-Chu (TW)

(72) Inventors: Yi-Tang Lin, Hsinchu (TW); Chih-Yu Hsu, Xinfeng Township (TW); Clement Hsingjen Wann, Carmel, NY (US); Chih-Sheng Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 158 days.

(21) Appl. No.: 14/017,564

(22) Filed: Sep. 4, 2013

(65) Prior Publication Data

US 2015/0060959 A1    Mar. 5, 2015

(51) Int. Cl.
*H01L 29/78* (2006.01)
*H01L 29/66* (2006.01)
*H01L 21/76* (2006.01)
*H01L 21/8238* (2006.01)
*H01L 21/84* (2006.01)
*H01L 27/092* (2006.01)
*H01L 27/12* (2006.01)

(52) U.S. Cl.
CPC .............. *H01L 29/785* (2013.01); *H01L 21/76* (2013.01); *H01L 21/823821* (2013.01); *H01L 21/845* (2013.01); *H01L 27/0924* (2013.01); *H01L 27/1211* (2013.01); *H01L 29/6681* (2013.01); *H01L 29/66795* (2013.01)

(58) Field of Classification Search
CPC .............. H01L 29/785; H01L 21/845; H01L 21/823821; H01L 29/6681; H01L 27/1211; H01L 27/0924; H01L 29/66795; H01L 21/76
See application file for complete search history.

(56) References Cited

U.S. PATENT DOCUMENTS

| | | | |
|---|---|---|---|
| 2012/0267721 A1* | 10/2012 | Chang et al. | 257/401 |
| 2013/0065326 A1* | 3/2013 | Sudo | 438/3 |
| 2013/0309838 A1* | 11/2013 | Wei et al. | 438/424 |
| 2014/0159166 A1* | 6/2014 | Basker et al. | 257/410 |
| 2014/0353795 A1* | 12/2014 | Tong et al. | 257/506 |

* cited by examiner

*Primary Examiner* — Yu Chen
*Assistant Examiner* — Nilufa Rahim
(74) *Attorney, Agent, or Firm* — Slater Matsil, LLP

(57) ABSTRACT

An embodiment fin field-effect transistor (FinFET) includes an inner fin, and outer fin spaced apart from the inner fin by a shallow trench isolation (STI) region, an isolation fin spaced apart from the outer fin by the STI region, the isolation fin including a body portion, an isolation oxide, and an etch stop layer, the etch stop layer interposed between the body portion and the isolation oxide and between the STI region and the isolation oxide, and a gate formed over the inner fin, the outer fin, and the isolation fin.

20 Claims, 24 Drawing Sheets

OFFSET=0nm

OFFSET=24nm

OFFSET=48nm

US 9,472,672 B2

ELIMINATING FIN MISMATCH USING ISOLATION LAST

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors are used in sub 32 nm transistor nodes. FinFETs not only improve areal density, but also improve gate control of the channel.

Unfortunately, as the fins of FinFETs become thinner and thinner, the processing steps used to fabricate the FinFETs may produce undesirable and unintended consequences. For example, the outermost fins in a FinFET may bend or bow outwardly after some thermal annealing processes such as isolation oxide curing and consolidation due to the different and non-balanced stress applied to the inner fins and outer fins of a FinFET, which changes the fin pitch between fins and degrades yield.

In addition, after etching and cleaning steps are performed critical dimensions such as fin width of inner and outer fins may vary due to environmental differences between inner fins and outer fins. The non-uniformity and mismatch between inner and outer fins will also degrade the electric performance of the FinFET.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a fin field-effect transistor (FinFET). The disclosure may also be applied, however, to other integrated circuits, electronic structures, and the like.

Figure 1:
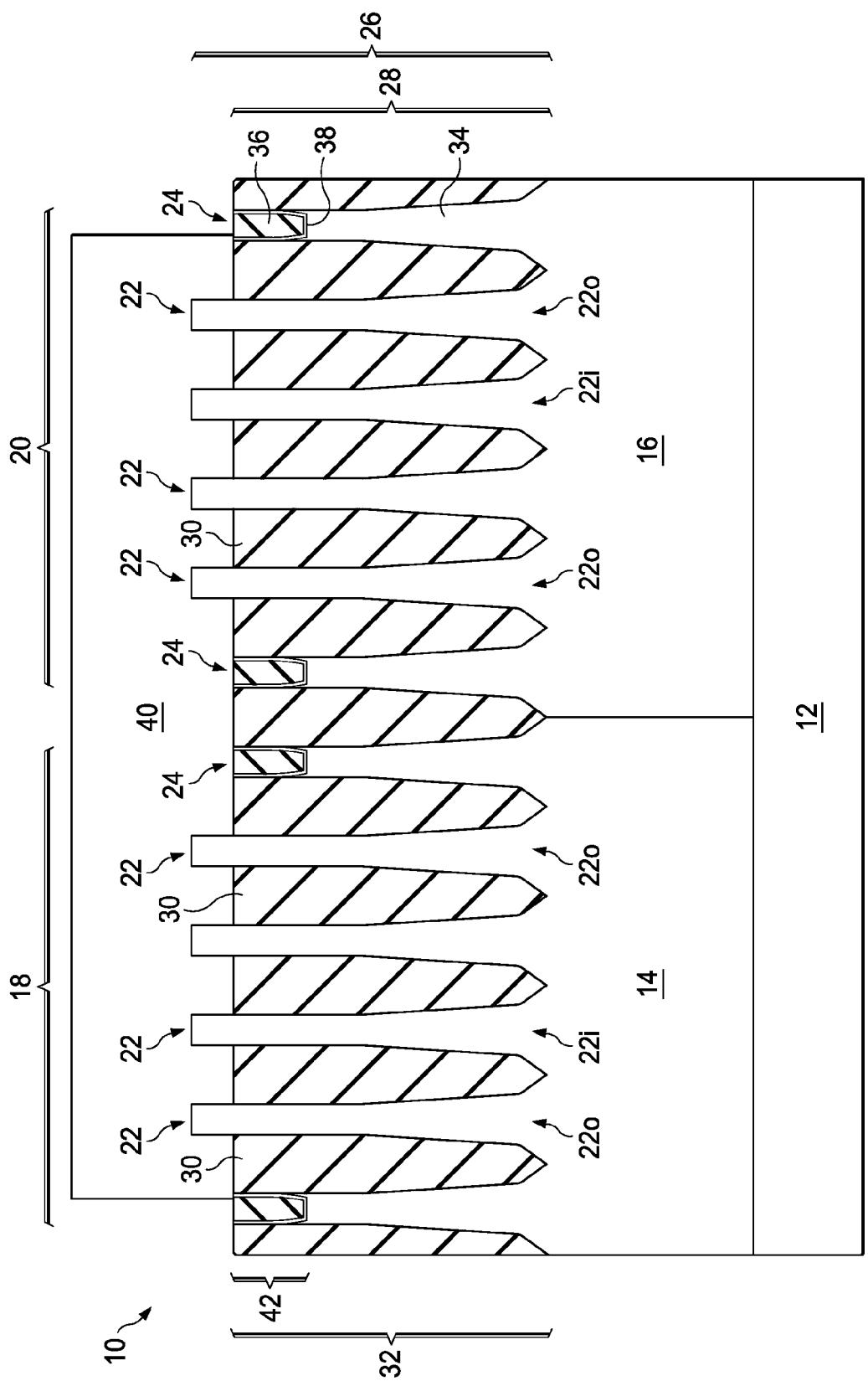
FIG. 1 illustrates an embodiment fin field-effect transistor (FinFET) including isolation fins capped with an isolation oxide partially wrapped by an etch stop layer.

Referring now to FIG. 1, an embodiment fin field-effect transistor (FinFET) 10 is illustrated. As shown, the FinFET 10 includes a semiconductor substrate 12. The semiconductor substrate 12 may be bulk silicon, germanium, silicon germanium, a silicon-containing material, silicon-on-insulator (SOI), or another suitable semiconductor material. In an embodiment, the semiconductor substrate 12 is a low-doped p-type substrate.

The semiconductor substrate 12 generally supports a first well 14 having a first doping type and a second well 16 having a second doping type. In an embodiment, the first well 14 is a p-well and the second well 16 is an n-well. However, the first and second wells 14, 16 and the semiconductor substrate 12 may be otherwise doped depending on, for example, the desired characteristics or performance of the FinFET 10.

Still referring to FIG. 1, a first group of fins 18 projects upwardly from the first well 14 and a second group of fins 20 projects upwardly from the second well 16. In an embodiment, the first group of fins 18 with p-well doping will form an n-type channel FinFET in later process steps. In an embodiment, the second group of fins 20 with n-well doping will form a p-type channel FinFET in later process steps. As shown, the first group of fins 18 includes four active fins 22 and two isolation fins 24 (which may also be referred to as dummy fins, and so on). Likewise, the second group of fins 20 also includes four active fins 22 and two isolation fins 24. While eight total active fins 22 and four total isolation fins 24 are illustrated in the FinFET 10 of FIG. 1, it should be recognized that practical applications may incorporate more or fewer active and/or isolation fins.

Because of their location within the FinFET 10, the active fins 22 in the first group of fins 18 and the second group of fins 20 may be referred to as either an inner fin 22i or an outer fin 22o depending on the location of the fin in the group. As depicted in FIG. 1, the outer fins are located immediately adjacent to the isolation fins 24 and the inner fins are disposed inwardly of the outer fins. In an embodiment, a height 26 of the inner fins and the outer fins is generally the same. In contrast, a height 28 of the isolation fins 24 is less than the height 26 of the inner and/or outer fins.

Still referring to FIG. 1, a shallow trench isolation (STI) region 30 is formed between each of the active fins 22 and the isolation fins 24. In an embodiment, the STI region 30 is formed from a spin-on-dielectric (SOD). In an embodiment, a depth 32 of the STI region 30 (a.k.a., isolation region, isolation oxide, sacrificial oxide, etc.) is between about one hundred sixty nanometers and about two hundred nanometers (160 nm-200 nm). In an embodiment, the depth 32 of the STI regions 30 may be the same as the height 28 of the isolation fins 24. Moreover, a top surface of the STI regions 30 and a top surface of the isolation fins 24 may be co-planar.

In an embodiment, each of the isolation fins 24 includes a body portion 34, an isolation oxide 36, and an etch stop layer 38. As shown in FIG. 1, the body portion 34 of the isolation fin 24 generally supports the isolation oxide 36 and the etch stop layer 38 from below. In an embodiment, the etch stop layer 38 is interposed between the body portion 34 and the isolation oxide 36. In an embodiment, the etch stop layer 38 is also interposed between the STI region 30 and the isolation oxide 36.

As shown, the etch stop layer 38 is generally disposed on sidewalls and a bottom surface of the isolation oxide 36. In addition, the etch stop layer is disposed on sidewalls of the STI region 30 adjacent to the isolation oxide 36. Further, the etch stop layer 38 is disposed on a top surface of the body portion 34 of the isolation fin 24. In other words, the etch stop layer 38 provides an interface between the body portion 34, the isolation oxide 36, and the adjacent STI regions 30. Indeed, each of the isolation fins 24 is capped with the isolation oxide 36, which is partially wrapped by the etch stop layer 38.

Still referring to FIG. 1, the gate 40 is formed over the first group of fins 18 and the second group of fins 20. In particular, the gate 40 is formed over the active fins 22 (i.e., the inner fins 22i and the outer fins 22o) and the isolation fins 24. As shown, a bottom surface of the gate 40 engages a top surface of the isolation oxide 36 in the isolation fins 24. Thus, the isolation oxide 36 of the isolation fins 24 is generally encapsulated by a combination of the bottom surface of the gate 40 and the etch stop layer 38. In an embodiment, the depth 42 of the isolation oxide 36 is between about thirty nanometers and about sixty nanometers (30 nm-60 nm).

Figure 2:
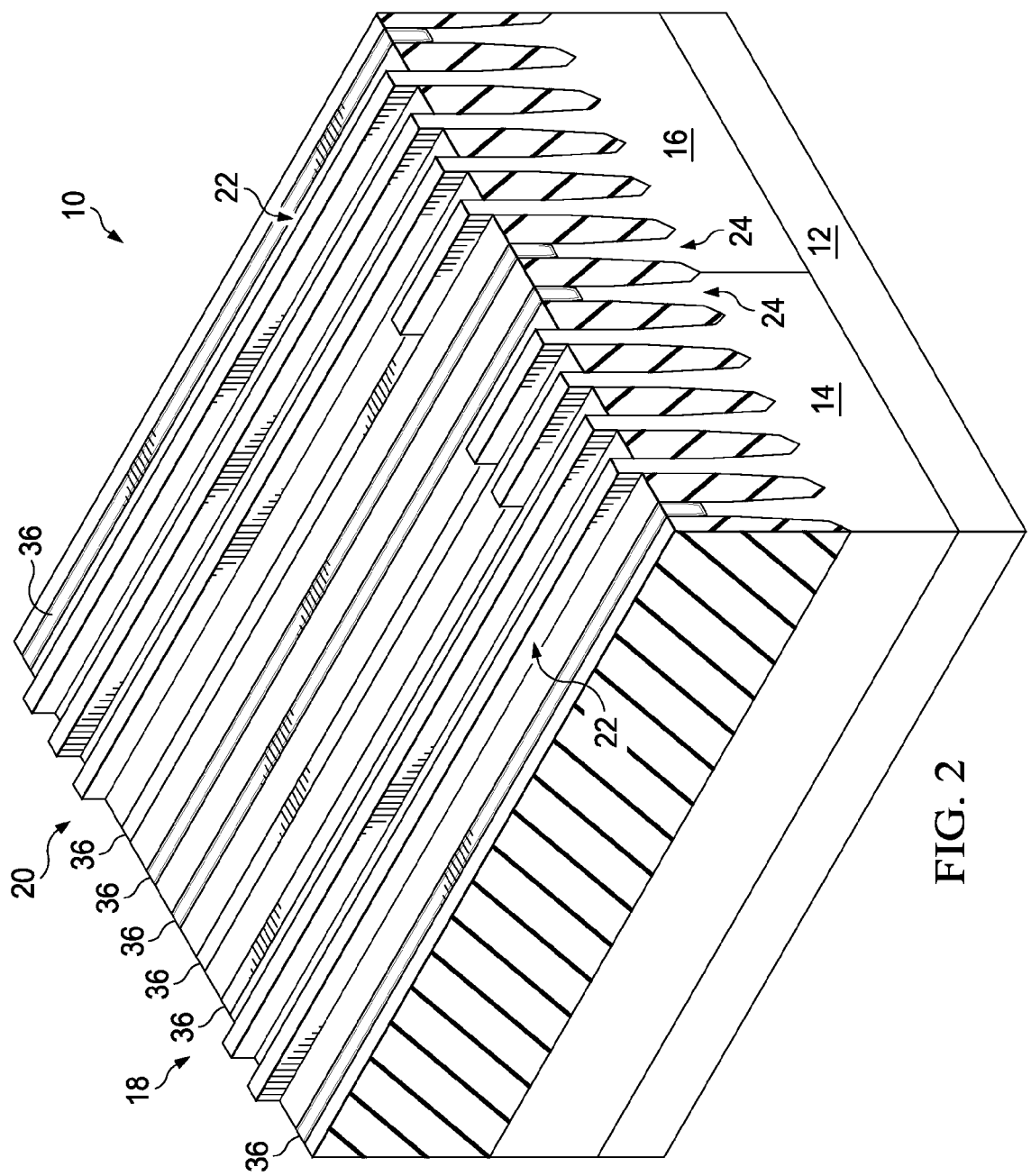
FIG. 2 illustrates the embodiment FinFET of FIG. 1 with a gate removed to better depict the isolation fins.
Figure 3:
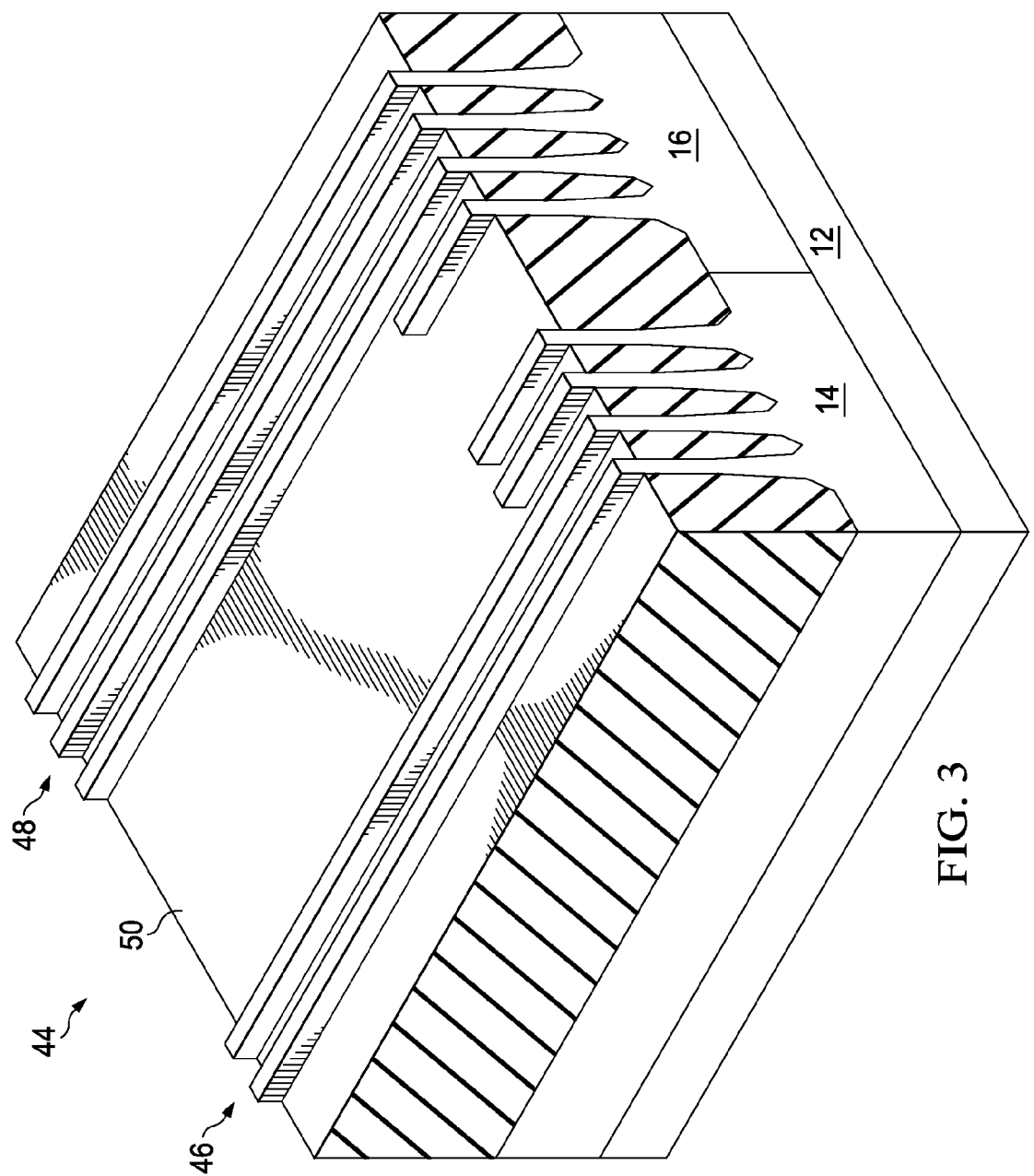
FIG. 3 illustrates a conventional FinFET where the isolation fins have been removed and the STI region alone isolates the first and second groups of fins from each other.

Unlike conventional FinFETs, the embodiment FinFET 10 of FIG. 1 includes at least one of the isolation fins 24 outside the outermost active fin 22o in each of the first group of fins 18 and the second group of fins 20. Indeed, the embodiment FinFET 10 in FIGS. 1-2 includes two of the isolation fins 24 between the first and second groups of fins 18, 20 to provide isolation of the devices from each other (the gate 40 has been removed in FIG. 2 for ease of illustration). In contrast, and as shown in the conventional FinFET 44 of FIG. 3, the dummy fins have been removed between the first and second groups of fins 46, 48. As such, the STI region 50 alone isolates the first group of fins 46 (e.g., the fins of an nMOSFET) from the second groups of fins 48 (e.g., the fins of a pMOSFET) in the conventional FinFET 44.

Referring now to FIGS. 4-19, an embodiment method of forming the FinFET of FIG. 1 using an isolation last technique is collectively illustrated relative to the process of forming the conventional FinFET 44. Beginning with FIG. 4, a pad oxide 52 and then a pad nitride 54 are blanket deposited over the semiconductor substrate 12. The pad oxide 52 and the pad nitride 52 may be deposited using any of a variety of suitable deposition processes (e.g., chemical vapor deposition (CVD), physical vapor deposition (PVD), and so on). Then, a first photo mask is used to etch the pad nitride 54 into the pattern shown in FIG. 4. Thereafter, the first photo mask is removed and the pad nitride 54, as patterned, is used to etch the underlying semiconductor substrate 12 to form a plurality of fins.

Figure 4:
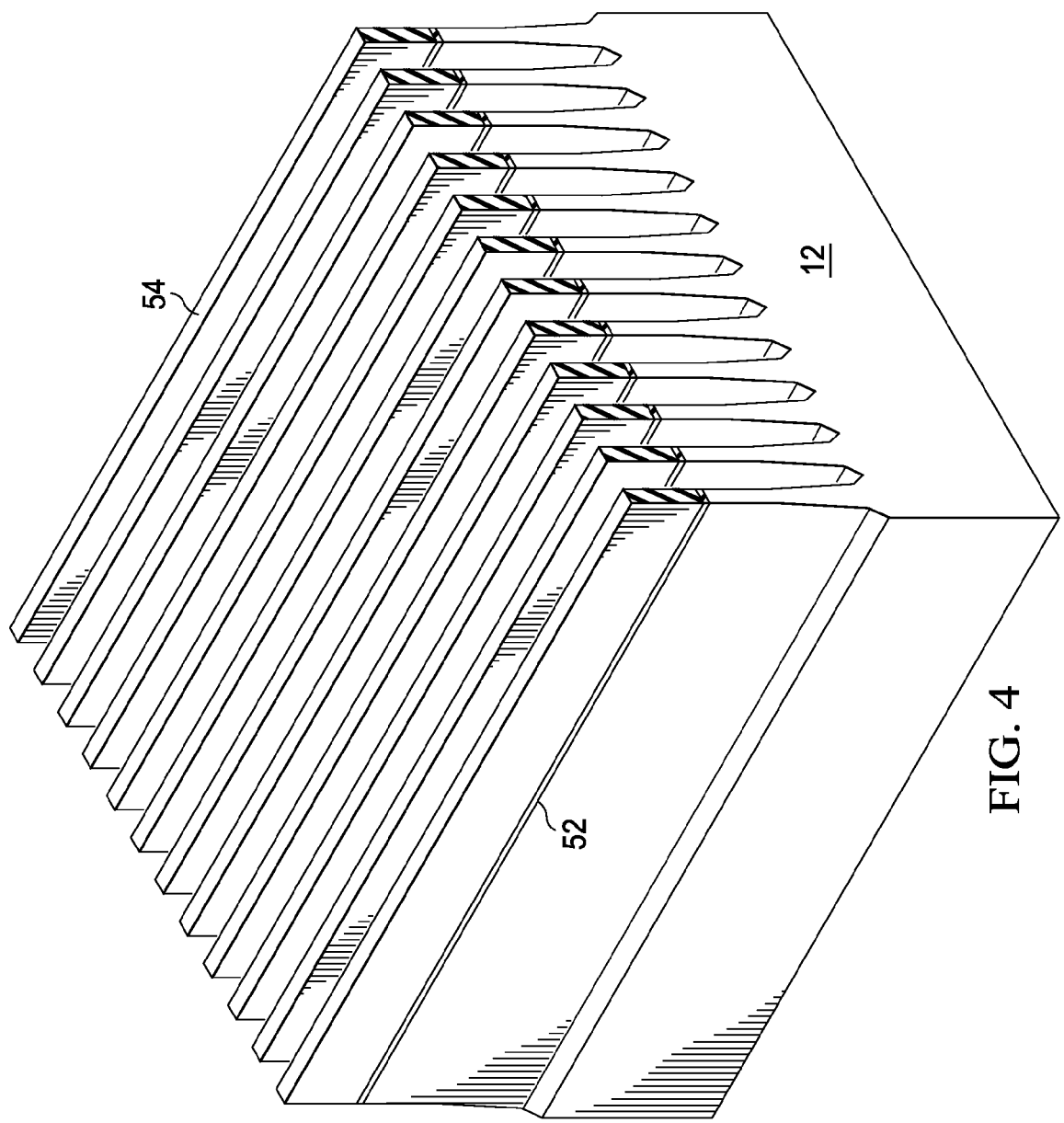
FIGS. 4-19 collectively illustrate an embodiment method of forming the FinFET of FIG. 1 using an isolation last technique and relative to the process of forming a conventional FinFET.

Notably, none of the fins in FIG. 4 has been removed. In other words, all of the fins, including those that will eventually serve as active fins 22 and those that will be used to form the isolation fins 24 (see FIG. 1), are retained. As such, the environment of all the fins is universally equivalent. Indeed, there is no difference between the inner fins, the outer fins, and those that will become the isolation fins 24. In contrast, during formation of the conventional FinFET 44 of FIG. 3, all of the dummy fins are removed as shown in FIG. 5.

Figure 5:
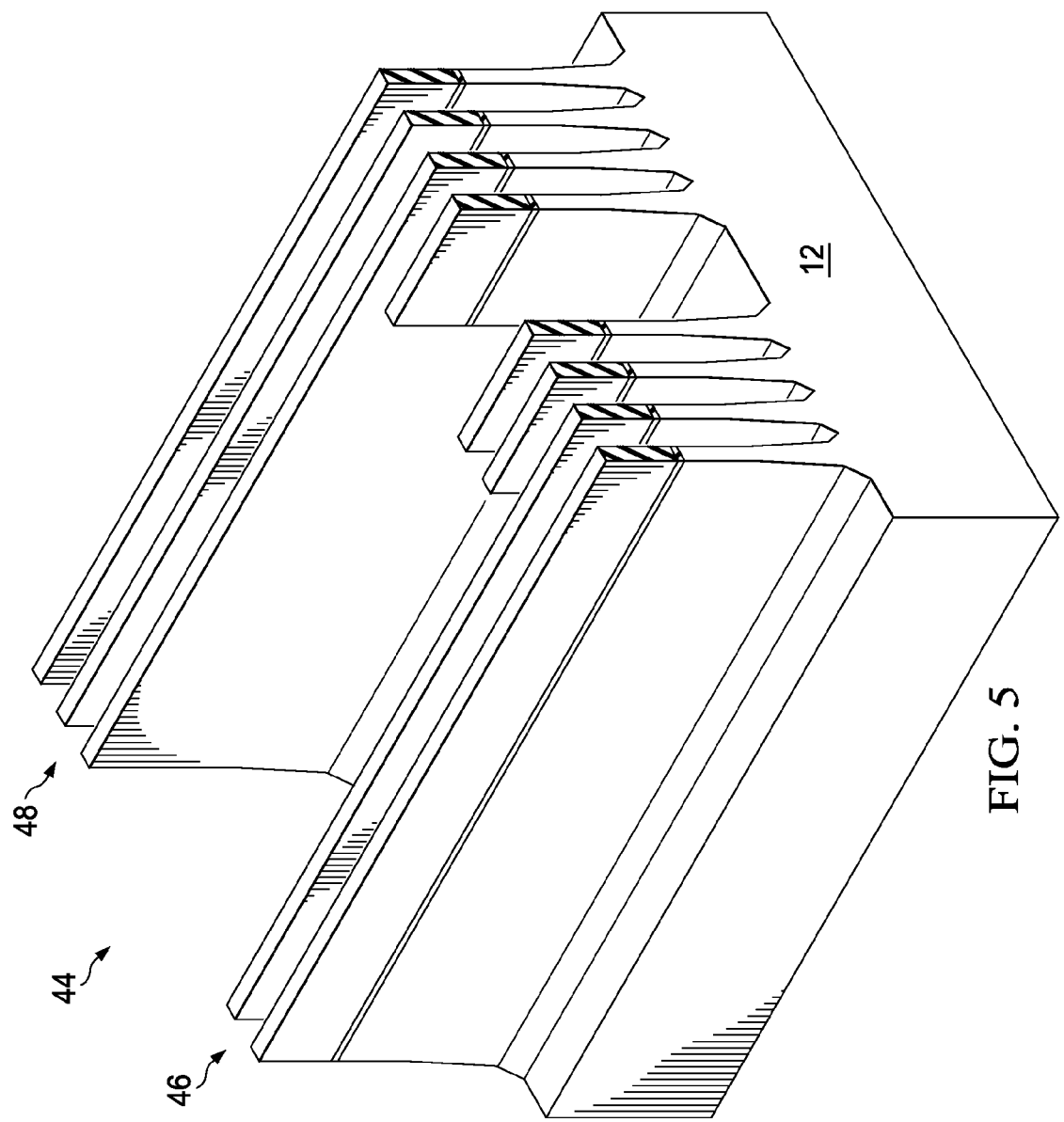
Figure 6:
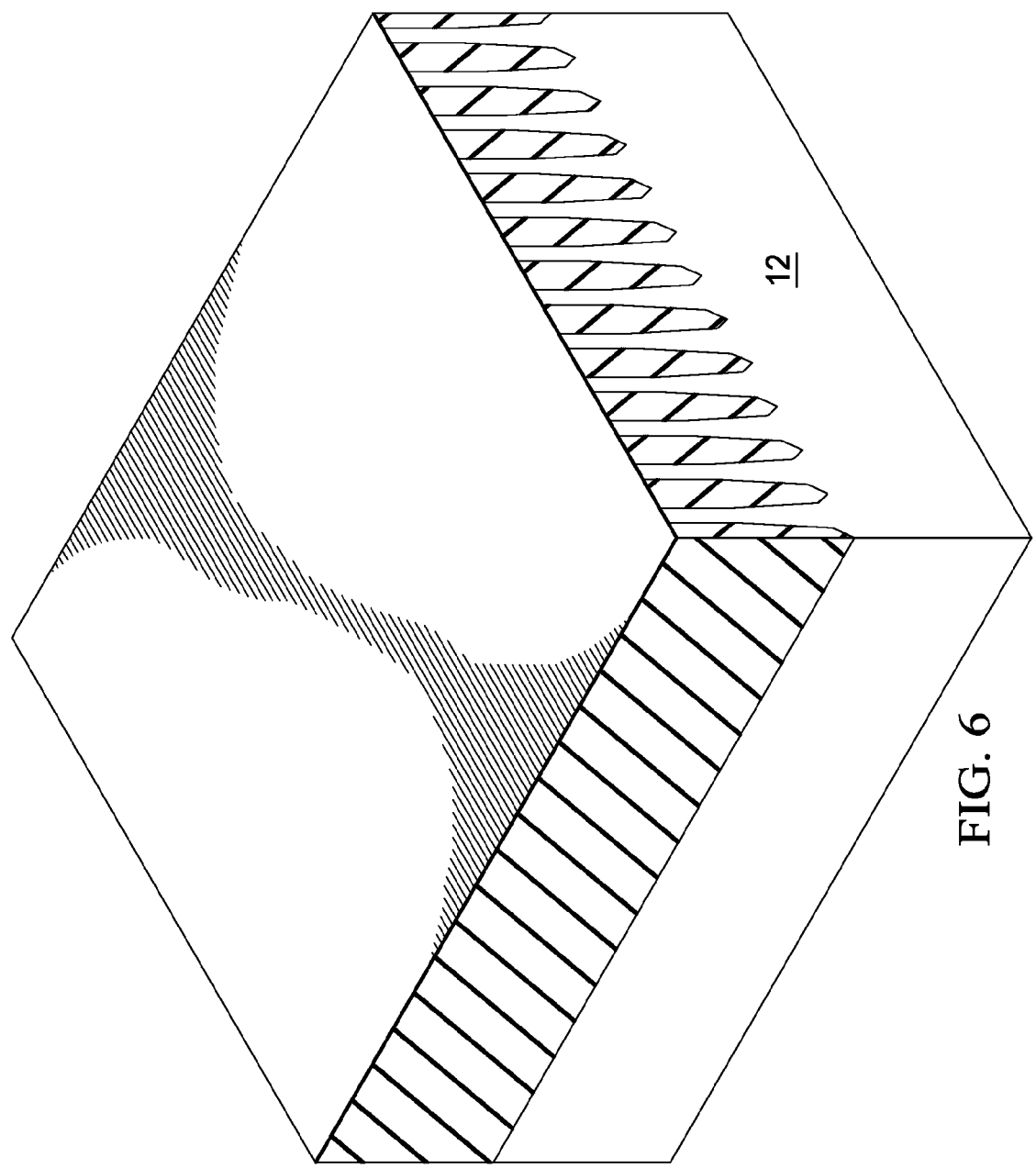
Figure 7:
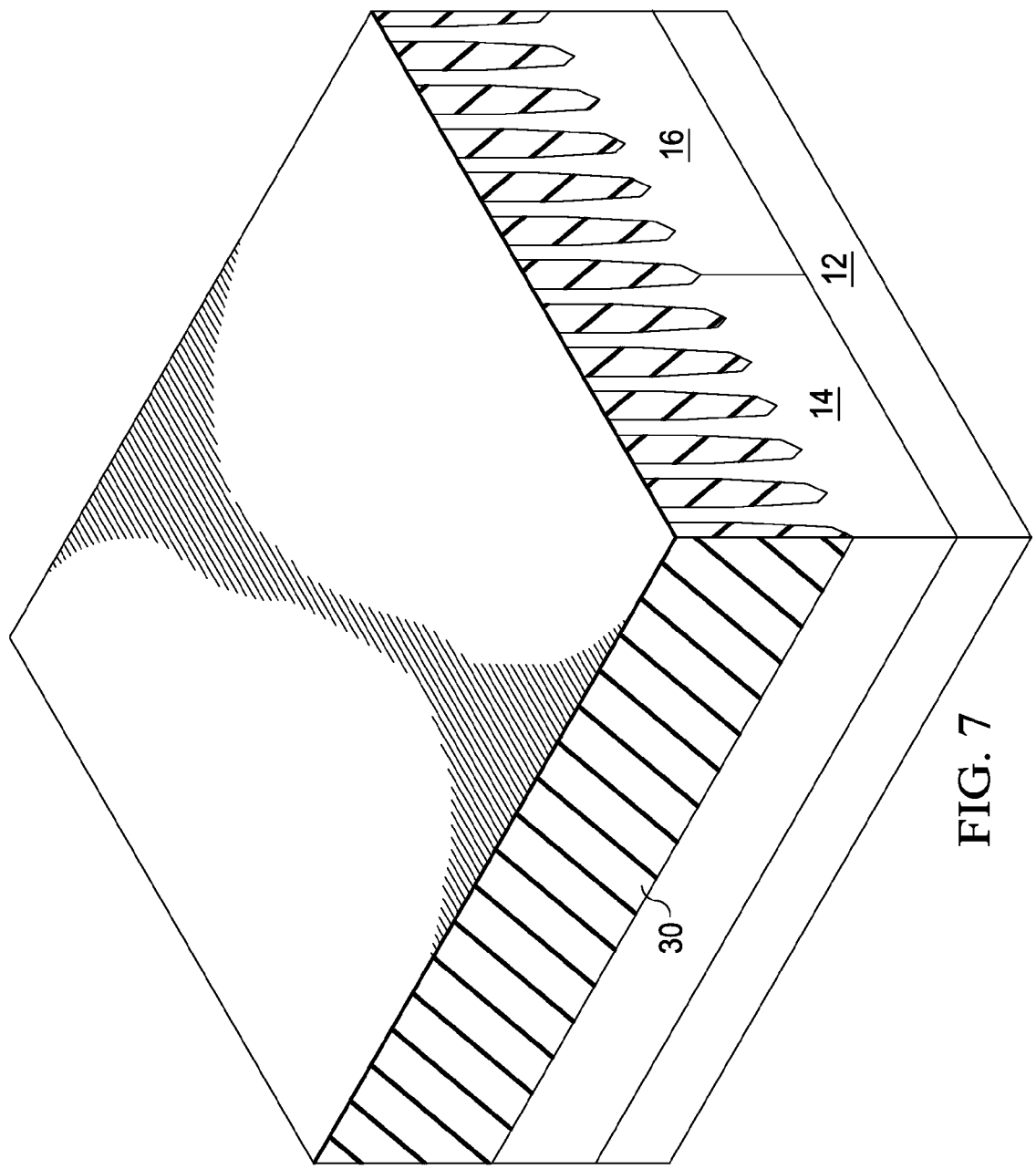

Referring now to FIGS. 5-6, a flowable STI oxide is deposited to fill the space between fins and form the STI region 30. Then, chemical mechanical polishing (CMP) process is employed to planarize the STI surface and to remove the pad nitride 54 and the pad oxide 52. Indeed, the pad nitride 54 may serve as a CMP stop layer. In general, a thermal annealing will be applied to cure and consolidate the flowable STI oxide material. Thereafter, a sacrificial oxide is deposited over the fins and an ion implantation process is performed in order to impart impurities to the fins and to form the first well 14 and the second well 16 in the semiconductor substrate 12 as shown in FIG. 7.

Figure 8:
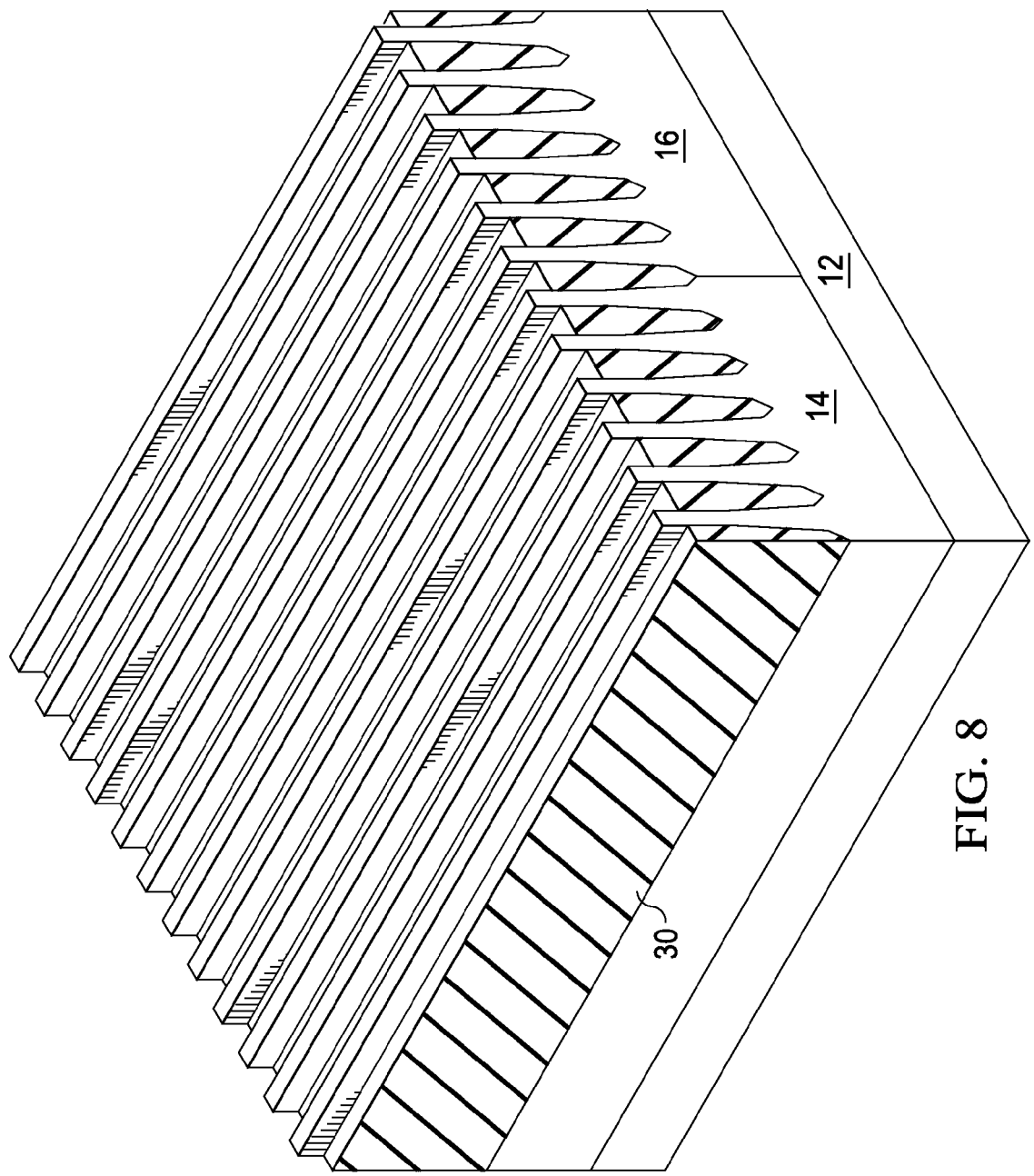
Figure 9:
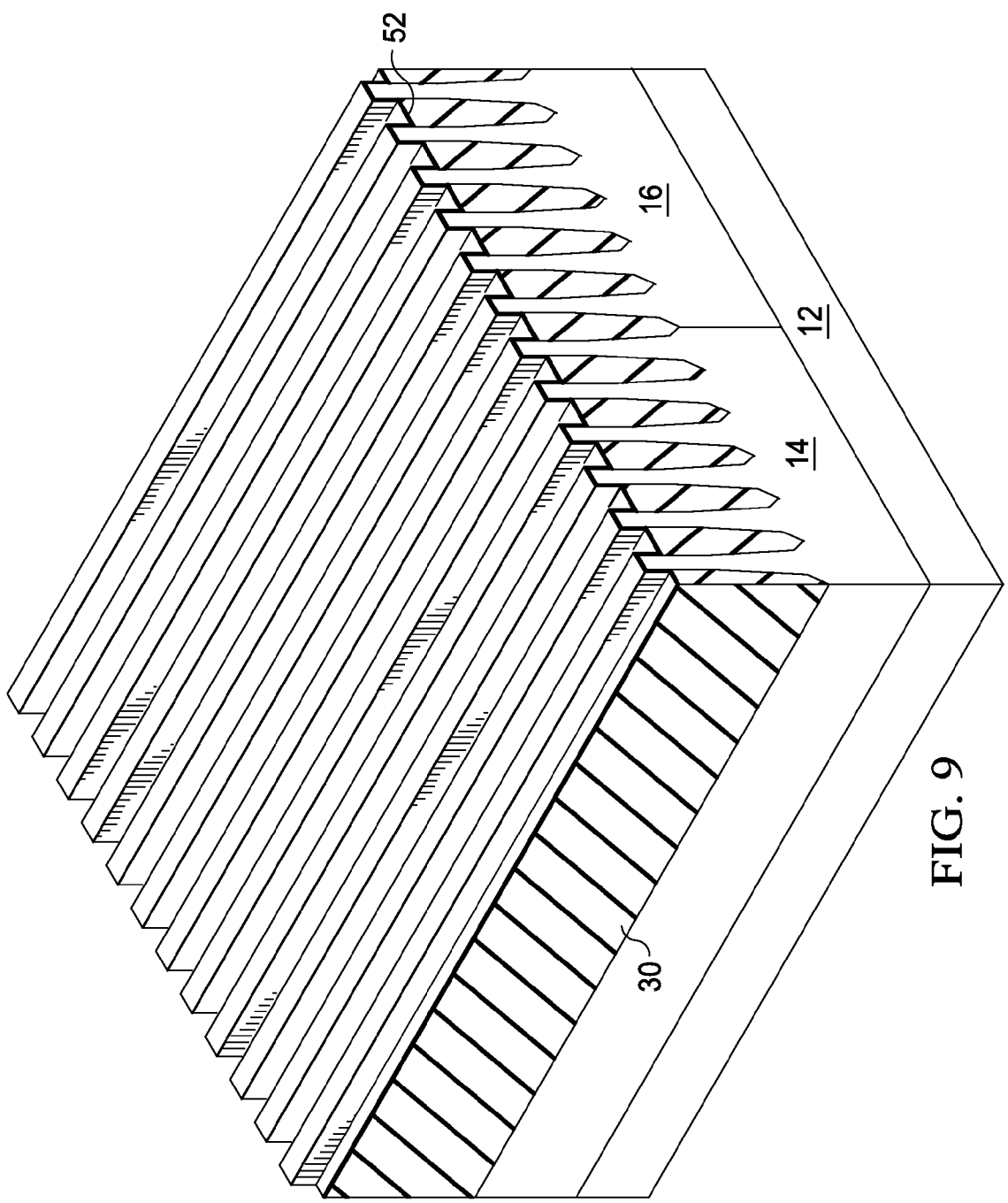
Figure 10:
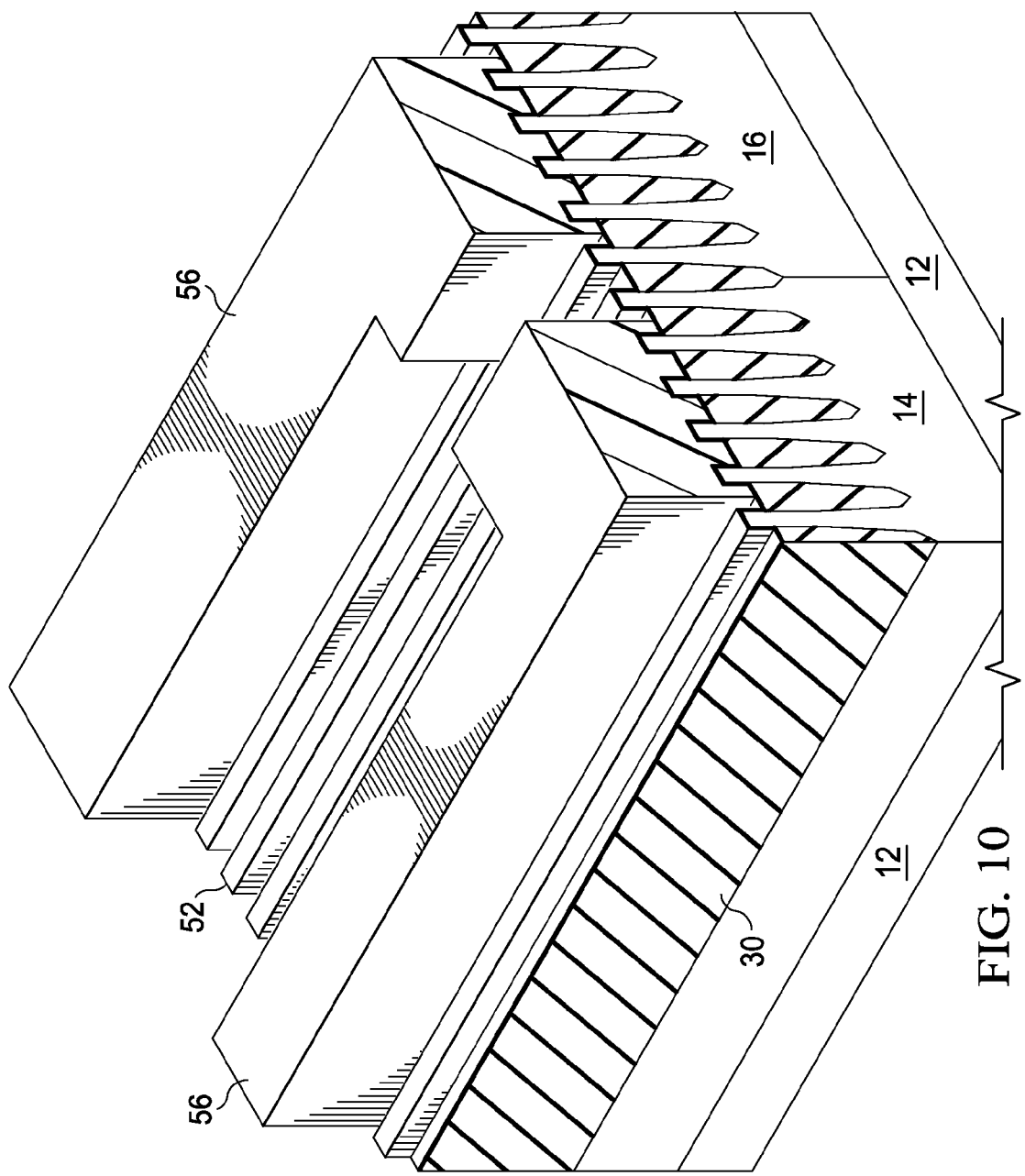

Referring now to FIG. 8, the sacrificial oxide is removed and then a portion of the STI region 30 is etched away to expose an upper portion of each of the fins. Thereafter, as shown in FIG. 9, another pad oxide 52 is deposited over the fins and the STI region 30. Next, as shown in FIG. 10, a hard mask 56 (i.e., a bottom layer after lithography exposure and development) is formed over the fins that will become the active fins 22 depicted in FIG. 1. The patterns of the hard mask 56 are defined by a mask.

Figure 11:
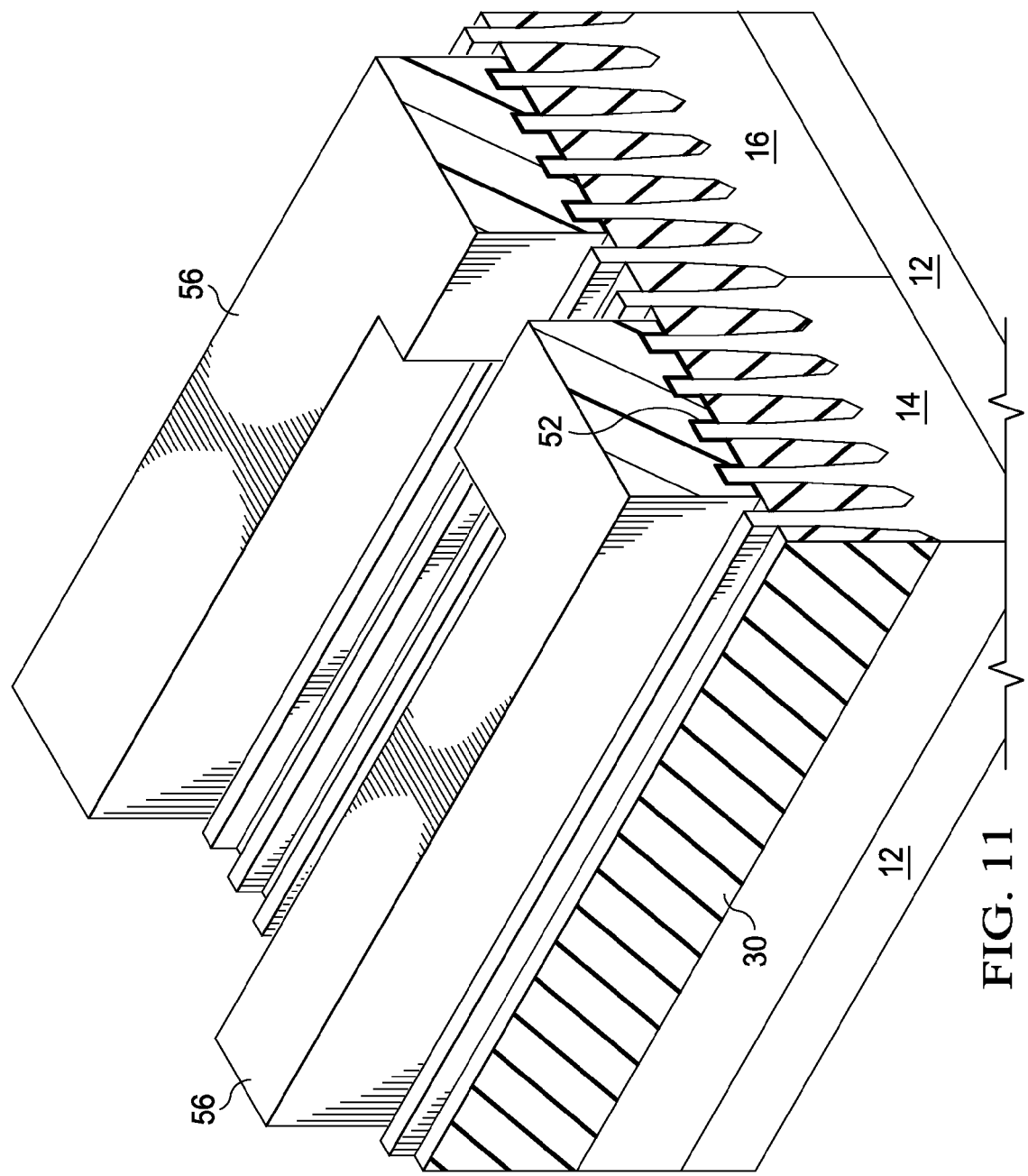
Figure 12:
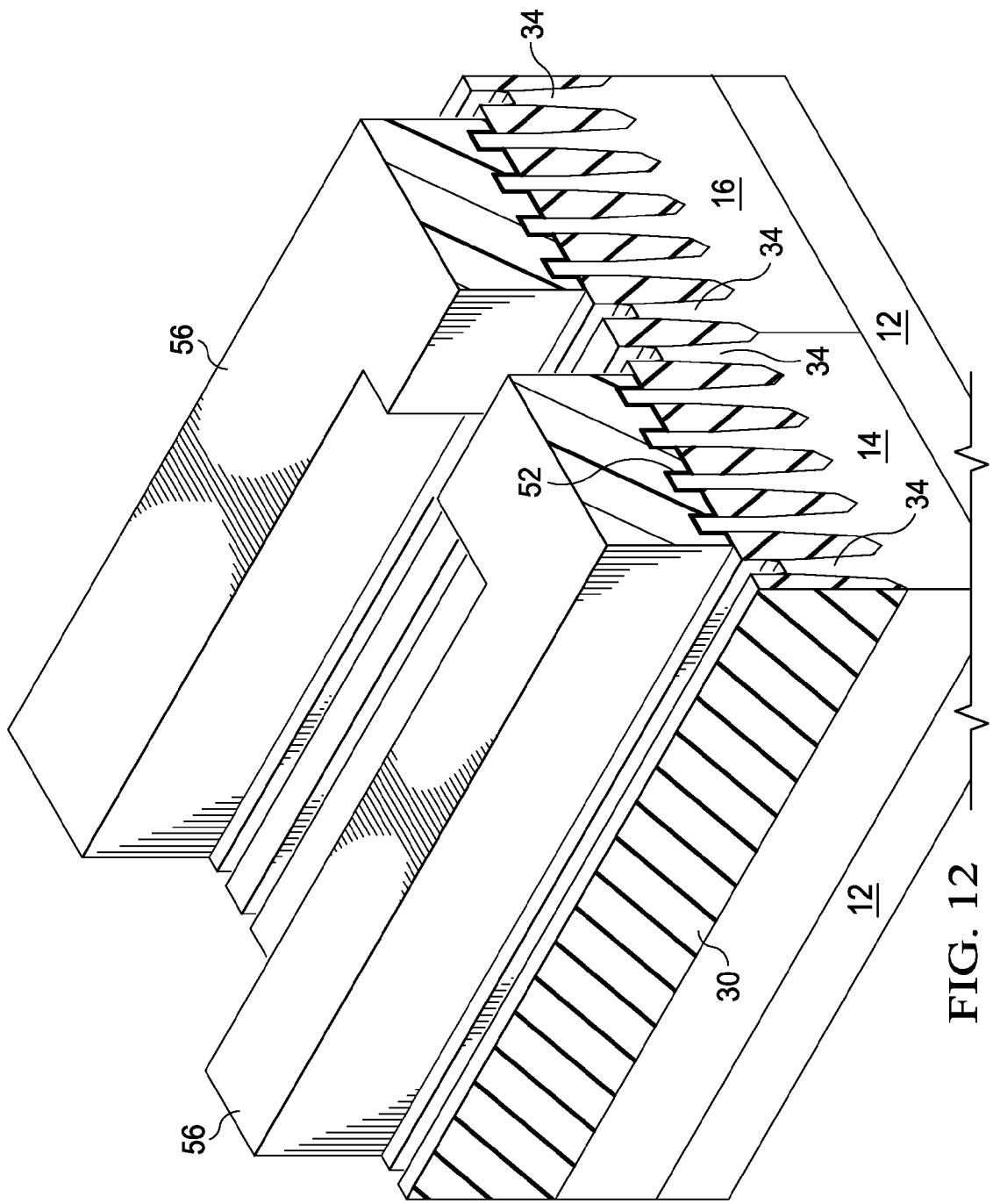
Figure 13:
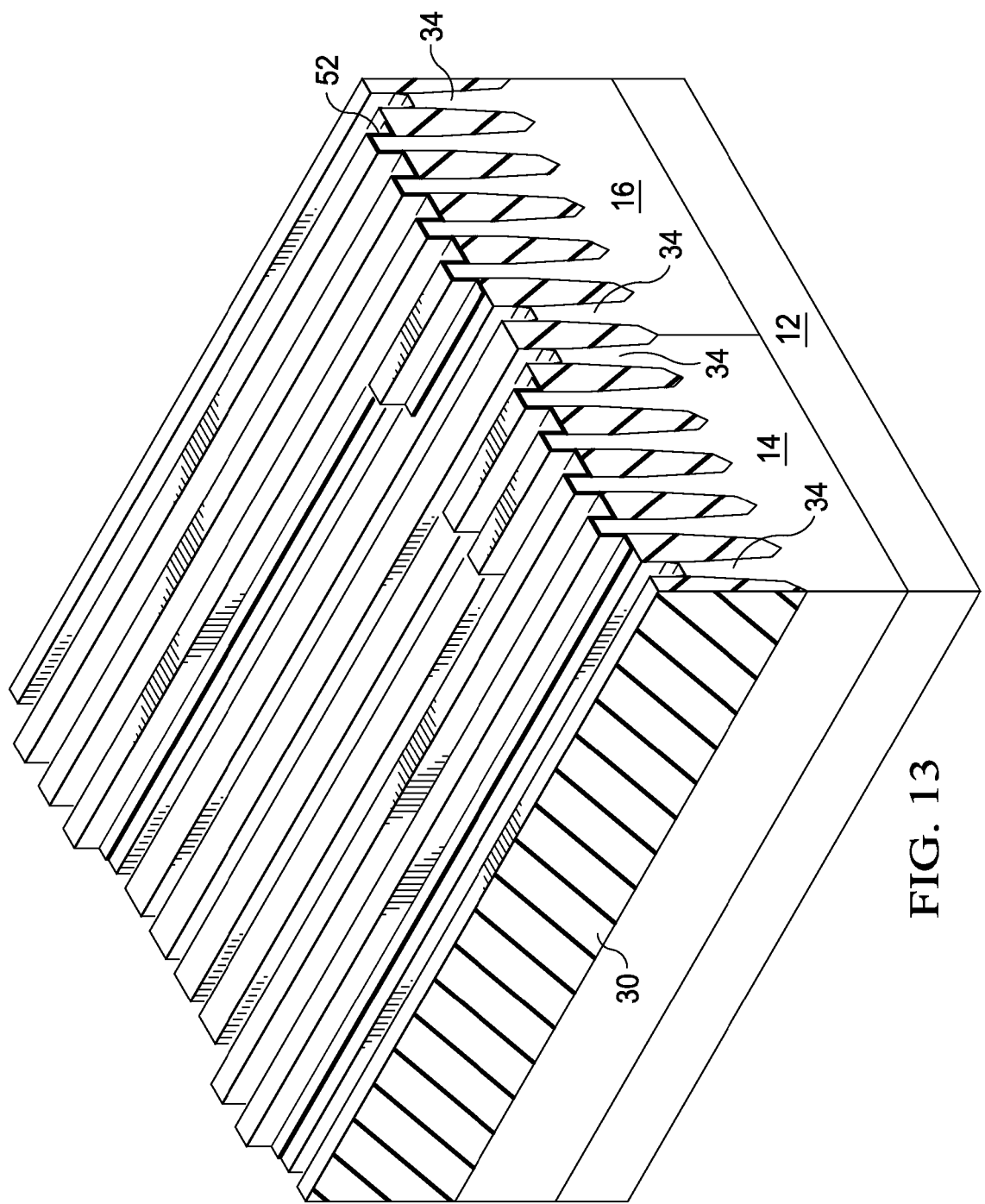
Figure 14:
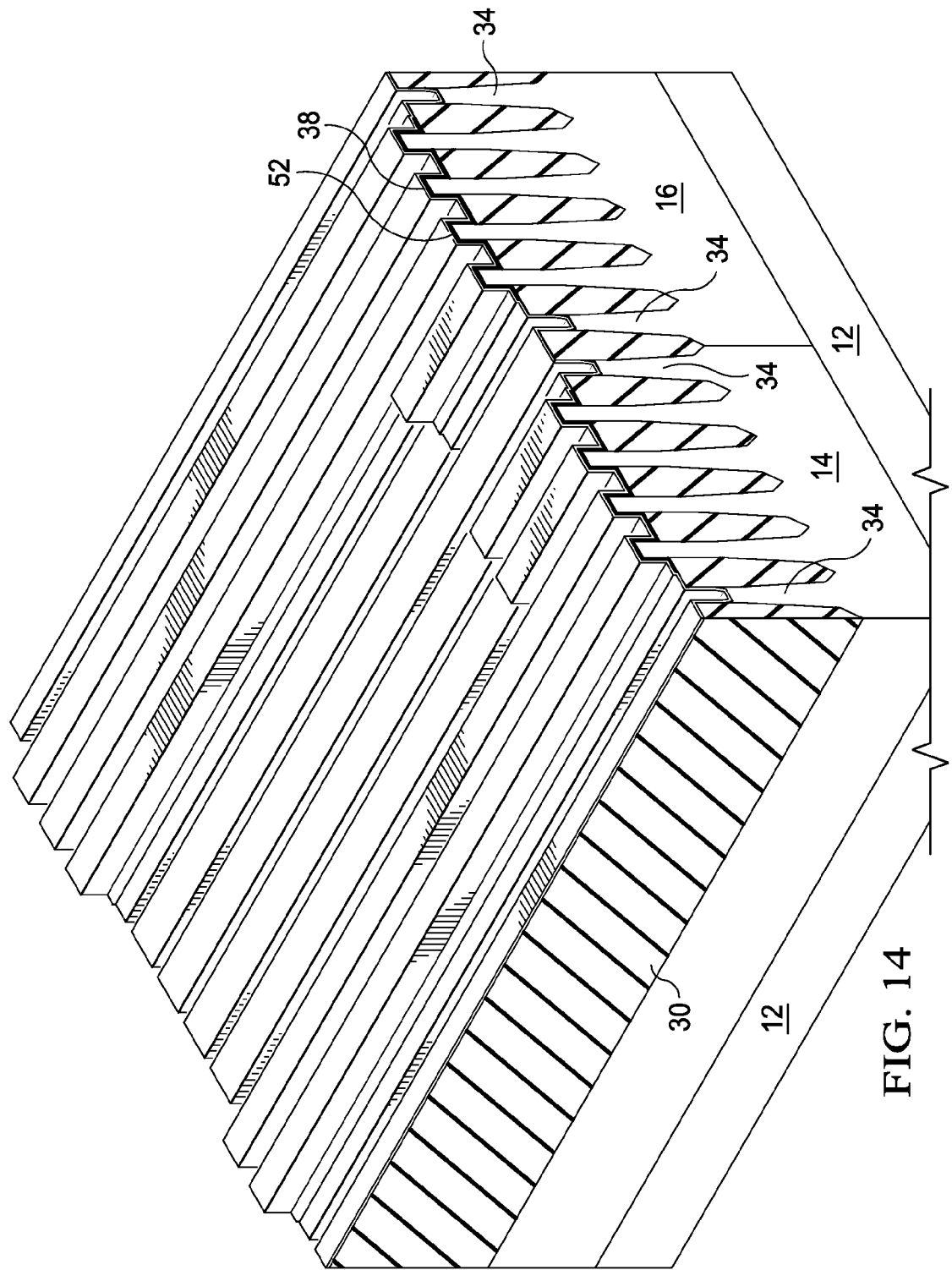

Referring now to FIG. 11, the pad oxide 52 disposed over the fins over those fins that will be used to form the isolation fins 24 of FIG. 1 is removed. Thereafter, a portion of fins exposed by removal of the pad oxide is recessed to form the body portion 34 shown in FIG. 12. Once the body portion 34 has been formed, the hard mask 56 (see FIG. 10) is removed as shown in FIG. 13. Next, as shown in FIG. 14, the etch stop layer 38 is deposited over the pad oxide 52 on the active fins 22, along sidewalls of the STI region 30 above the body portion 34, and on a top surface of the body portion 34.

Figure 15:
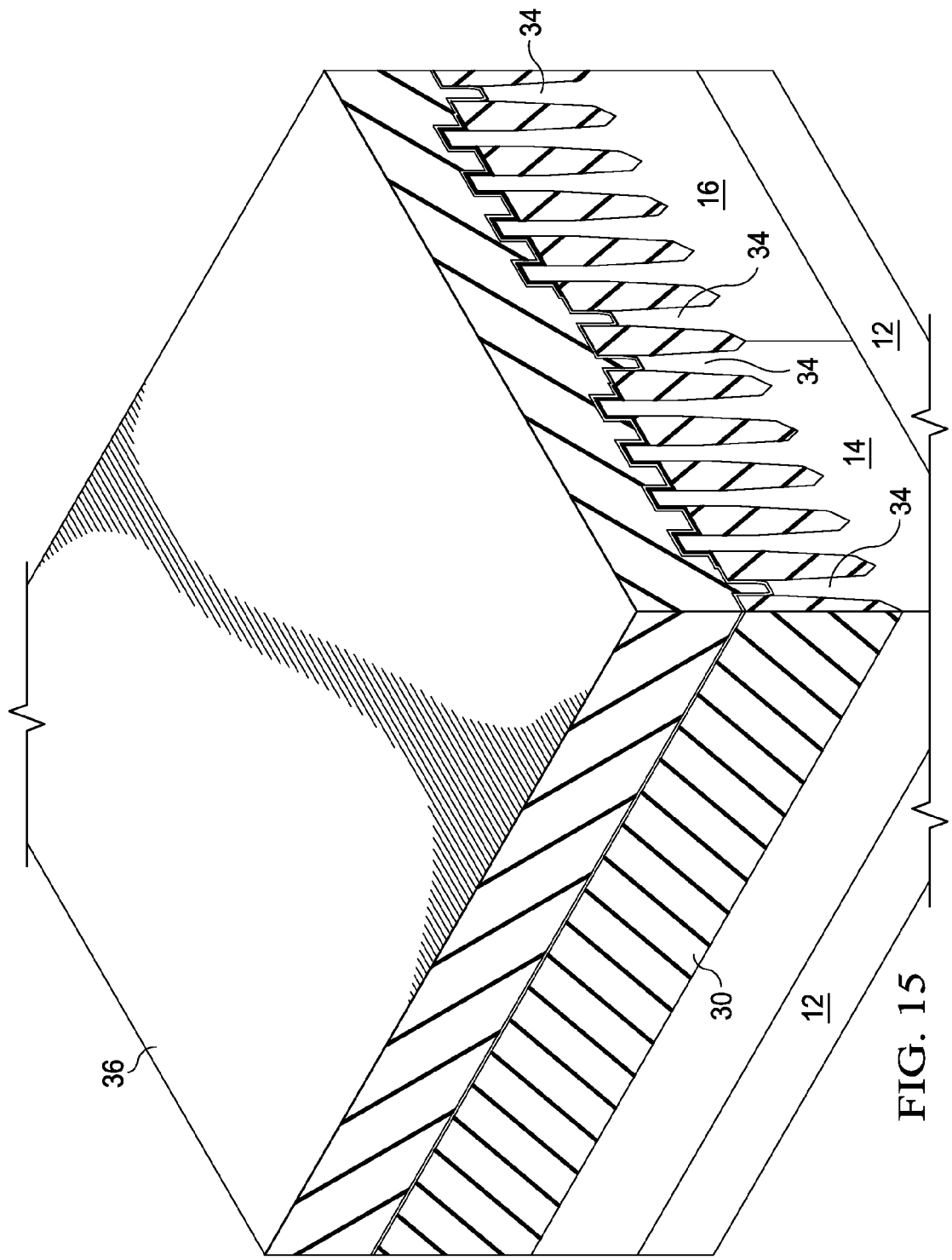
Figure 16:
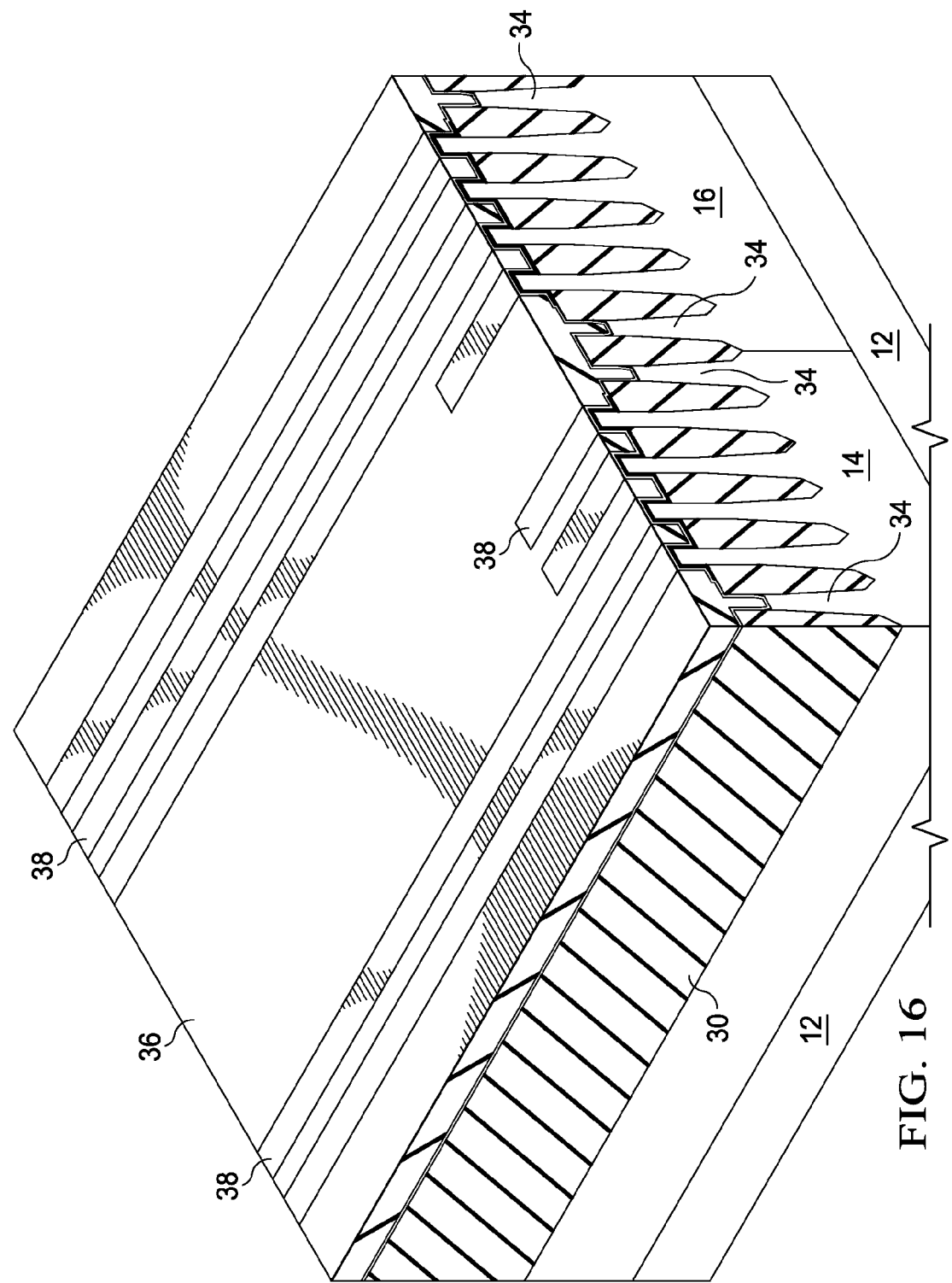

Thereafter, as shown in FIG. 15, the isolation oxide 36 is deposited over the etch stop layer 38 and then cured. In an embodiment, the isolation oxide 36 deposited using a flowable chemical vapor deposition (FCVD) process. Even so, other suitable deposition processes may be used. Next, as shown in FIG. 16, the isolation oxide 36 is planarized until reaching the etch stop layer 38 on a top surface of the active fins 22. In an embodiment, the isolation oxide is planarized using a chemical mechanical polishing (CMP) process.

Figure 17:
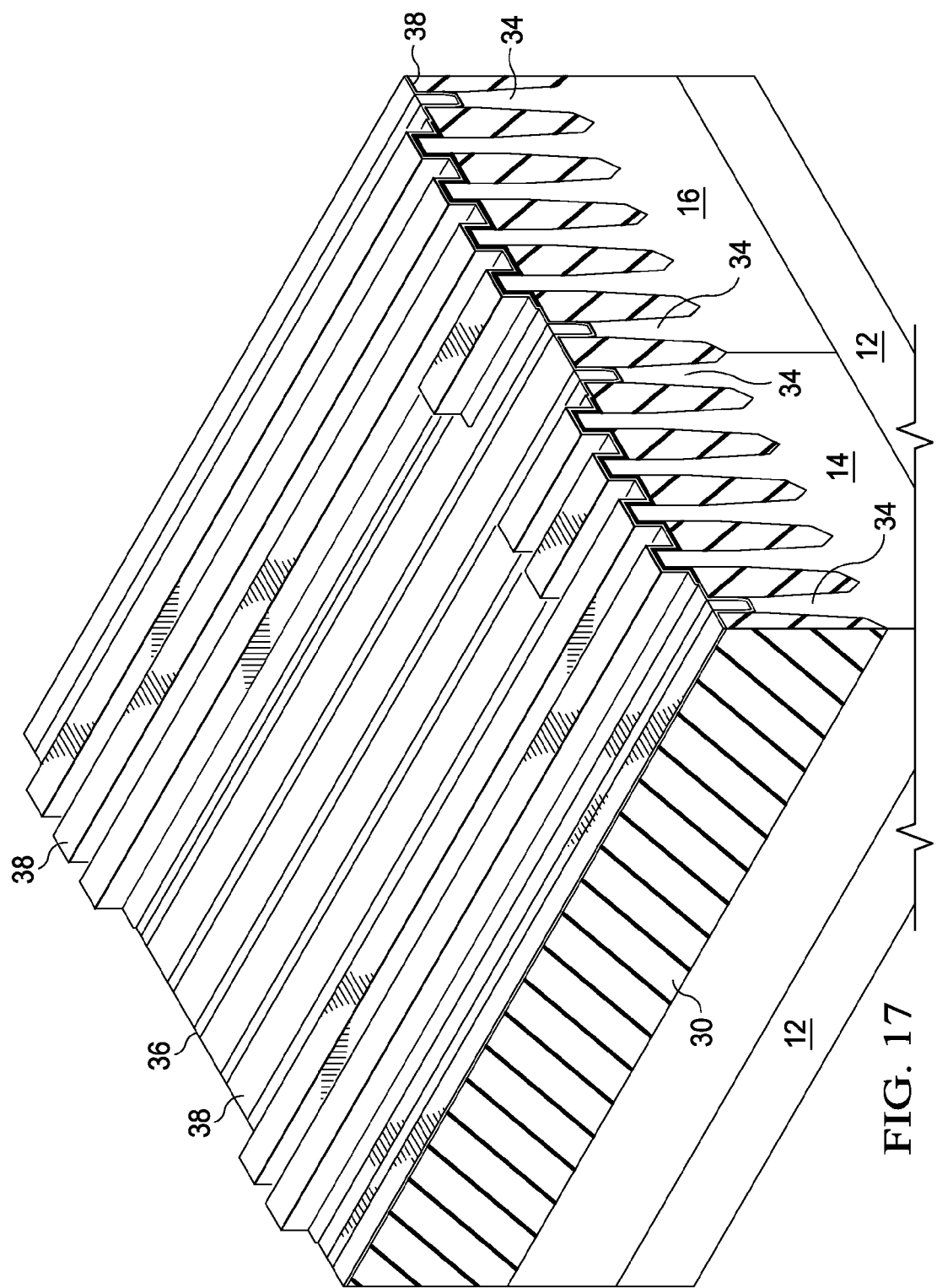
Figure 18:
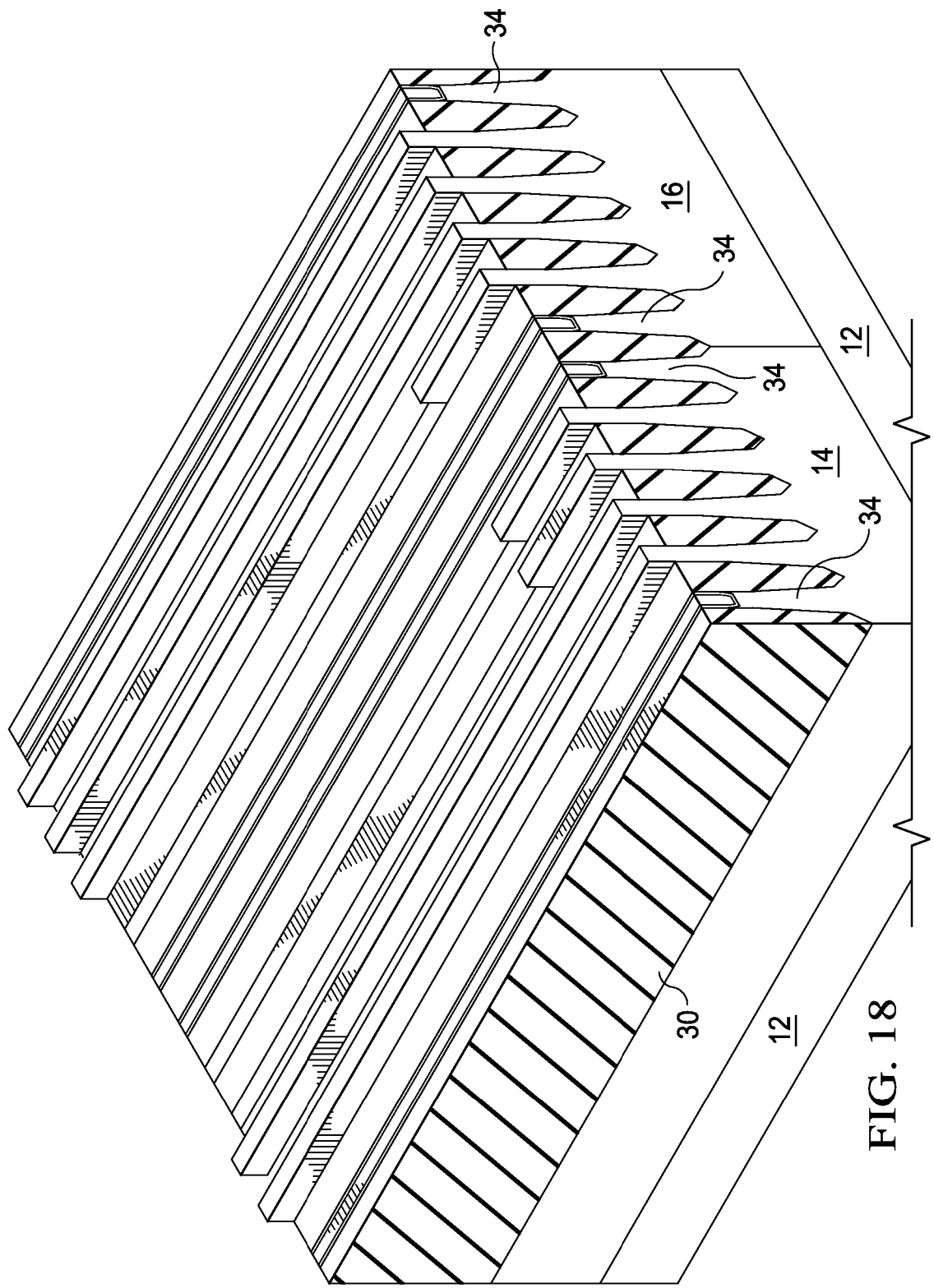
Figure 19:
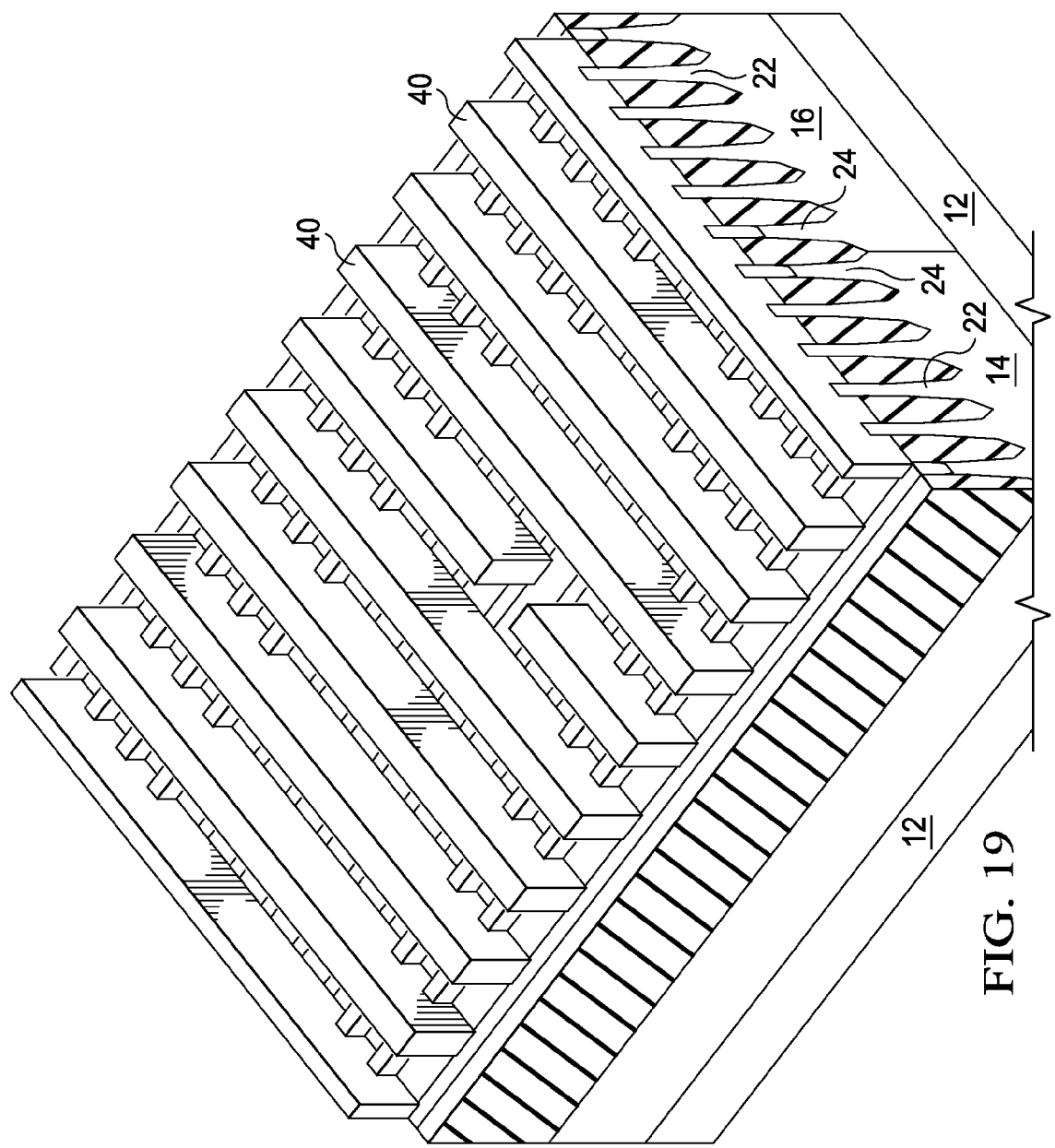

As shown in FIGS. 16-17, the isolation oxide 36 is etched away until the etch stop layer 38 disposed on the top surface of the STI region 30 is reached. As such, and an illustrated FIG. 1, the isolation oxide 36 below the etch stop layer 38, the etch stop layer 38 along sidewalls of the STI region 30, and the body portion 34 form the isolation fin 24. With the isolation fin 24 formed, the etch stop layer 38 and the pad oxide 52 disposed over the top surface of the STI region and the active fins is removed as shown in FIG. 18. Then, as depicted in FIG. 19, gates 40 are formed over the active fins 22 and the isolation fin 24.

Figure 20:
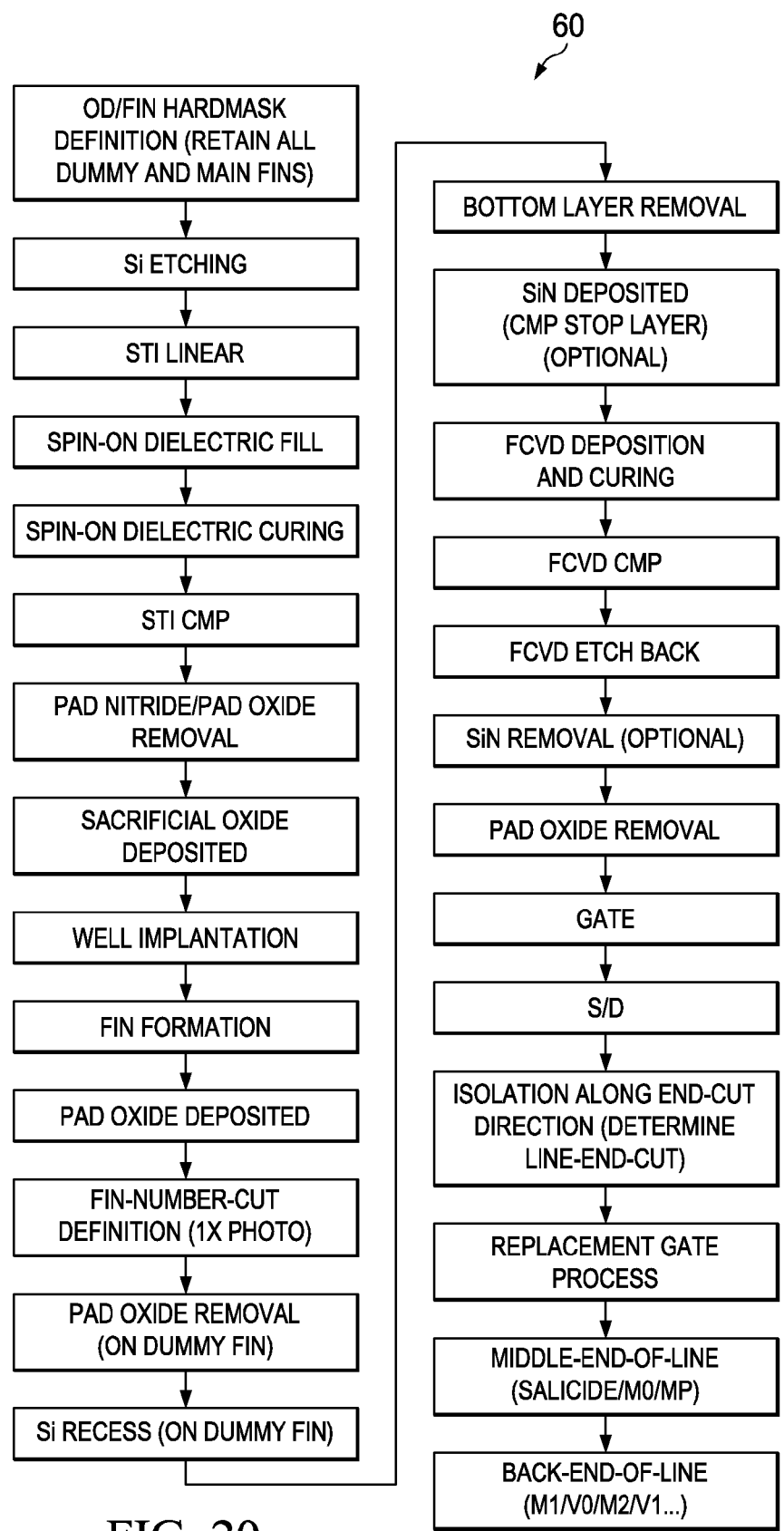
FIG. 20 illustrates a detailed process flow used to form the FinFET of FIG. 1.

Referring now to FIG. 20, an embodiment of a detailed process flow 60 used to form the embodiment FinFET 10, or a variant thereof, is provided. The process flow 60 generally augments the process steps illustrated in FIGS. 4-19. The process flow 60 of FIG. 20 begins with an OD/Fin hardmask definition, which ensures that all dummy and main fins are retained. Thereafter, an Si etching and an STI linear process are performed. Next, spin-on-dielectric (SOD) filling and curing process are performed. Continuing, the STI is subjected to a CMP process whereby the pad nitride and pad oxide are removed. Next, a sacrificial oxide is deposited and a well implantation is performed.

After well formation, the fins are formed. With the fins having been defined, a pad oxide is deposited and a fin-number-cut definition using a single photolithography step is performed. Next, the pad oxide is removed on the dummy fin(s) and a silicon recess on the exposed dummy fin(s) is performed. Then, the bottom layer (BL) remaining from the photolithography step is removed.

Next, a silicon nitride layer is deposited to provide a CMP stop. With the CMP stop in place, a FCVD deposition process is performed to provide a layer of oxide, which is then cured. Continuing, the oxide is subjected to a CMP and an etch-back process. Once the etching has occurred, the silicon nitride is removed along with the pad oxide. Thereafter, the gate (or gate stack) and the source/drain regions are formed.

Next, an isolation process is performed along the end-cut direction. In other words, the line-end-cut is determined. Then, a replacement gate process (RPG) is performed. Thereafter, middle-end-of-line (MEOL) (e.g., salicide, M0, MP) and a back-end-of-line (BEOL) (M1, V0, M2, V1, etc.) processes are performed to provide the desired metallization and interconnects in the device.

Figure 21:
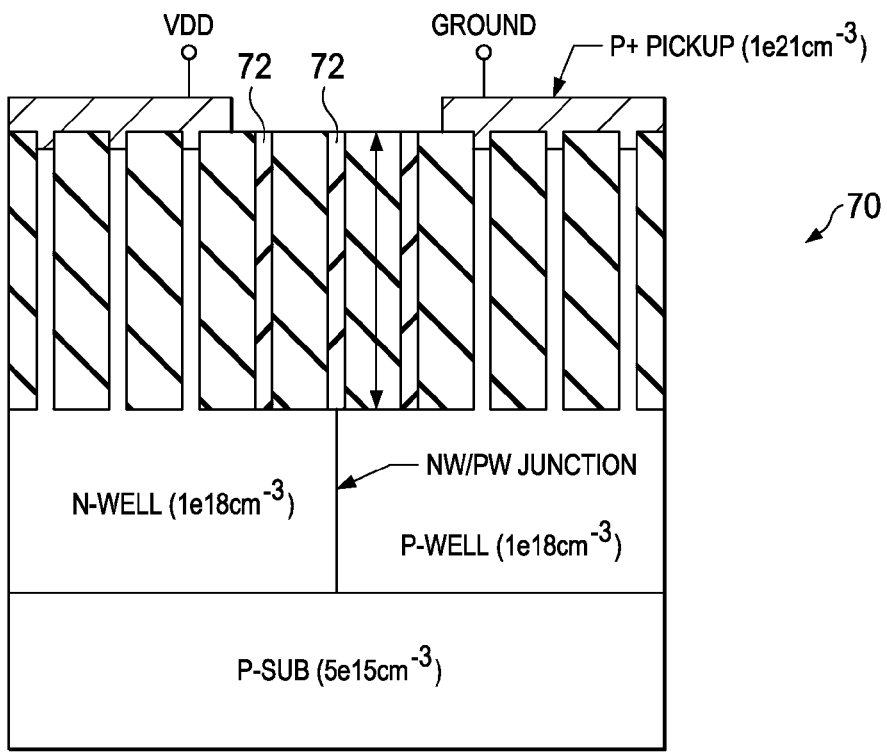
FIGS. 21-22 illustrate a conventional FinFET next to the embodiment FinFET of FIG. 1 for comparison purposes.
Figure 22:
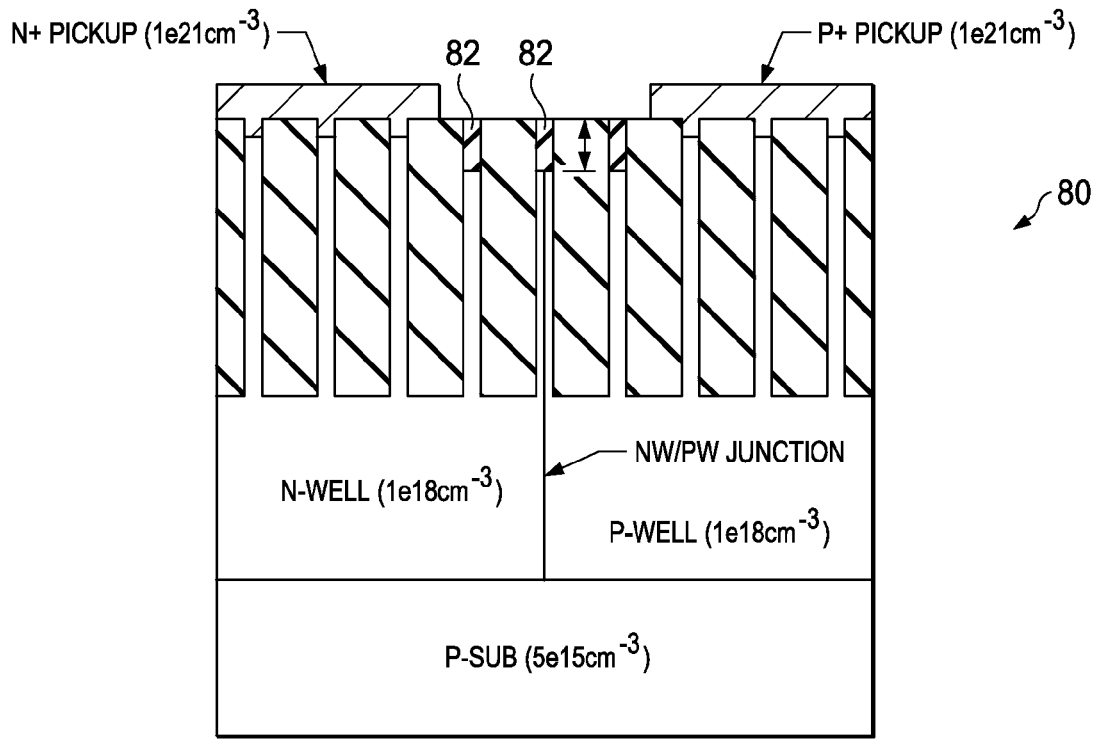

Referring now to FIGS. 21-22, a conventional FinFET 70 is depicted next to an embodiment FinFET 80 for comparison purposes. As shown, the isolation oxide 72 occupying the space of the removed dummy fins in the conventional FinFET 70 extends from the top surface of the device down to the junction between the n-well and p-well. In contrast, the isolation oxide 82 in the embodiment FinFET 80 is much shorter because the dummy fins in the middle of the device were not removed. Indeed, as noted above, the dummy fins in the center of the embodiment FinFET 80 only had an upper portion removed. In an embodiment, the isolation depth of the isolation oxide 82 (represented by the arrow in FIG. 22) may be about 30 nm. This is much less that the isolation depth of the isolation oxide 72 (represented by the arrow in FIG. 22), which is generally about 180 nm.

Figure 23A:
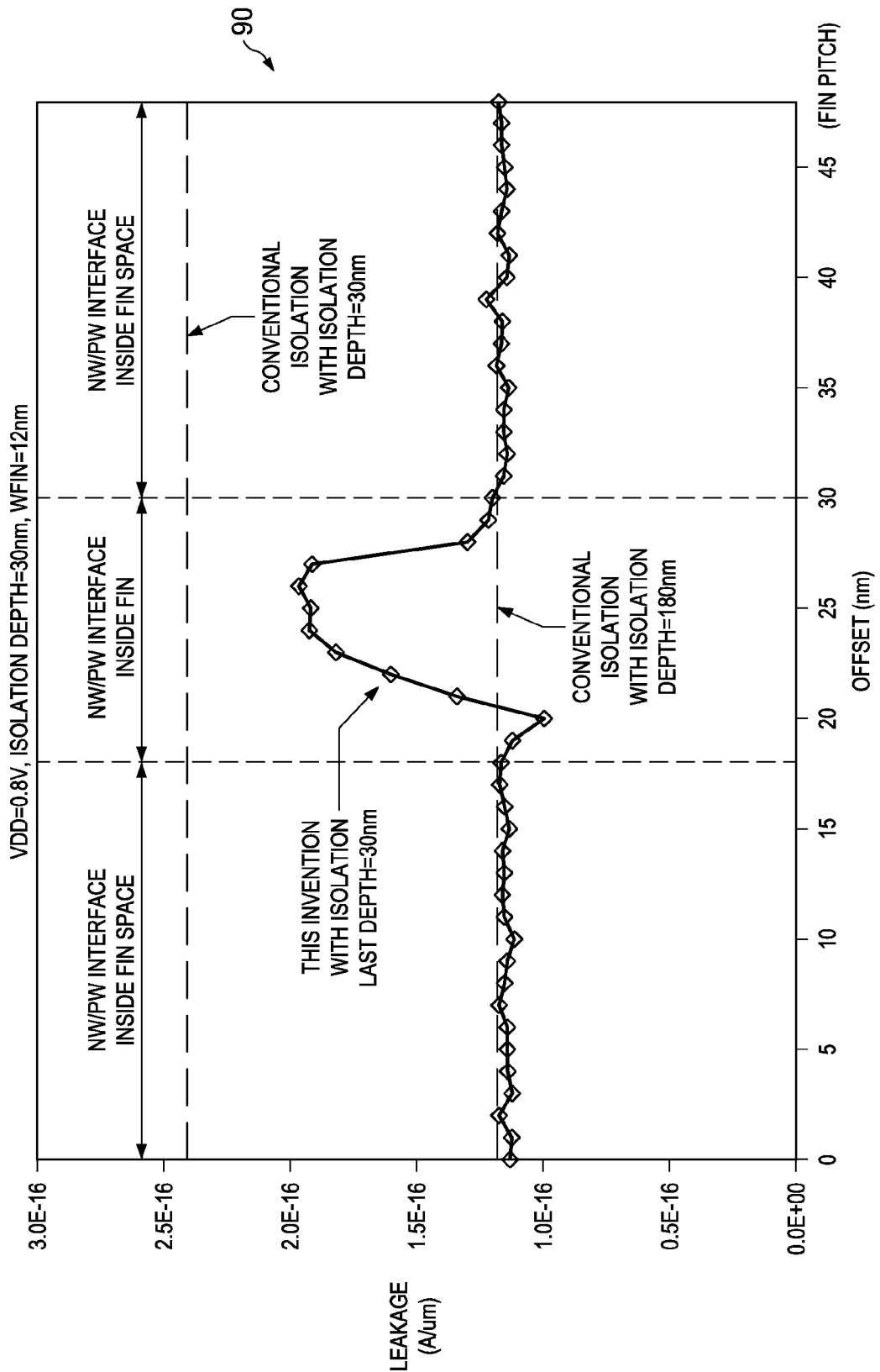
FIG. 23A is a chart illustrating a leakage current relative to various junction offsets.
Figure 23B:
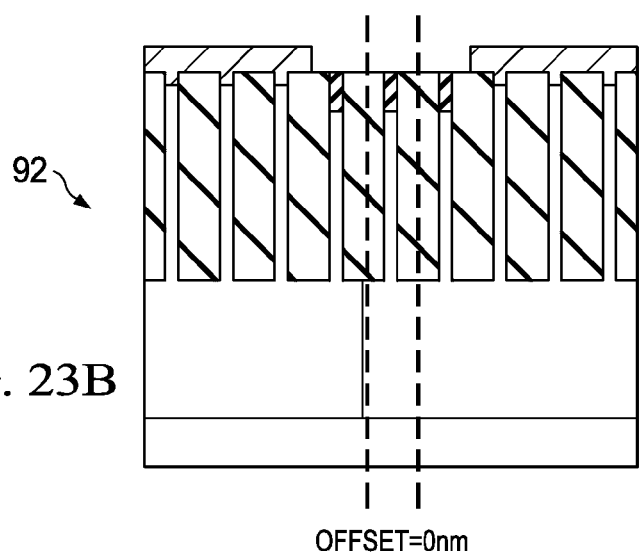
FIGS. 23B-23D illustrate various offsets in a FinFET device.
Figure 23C:
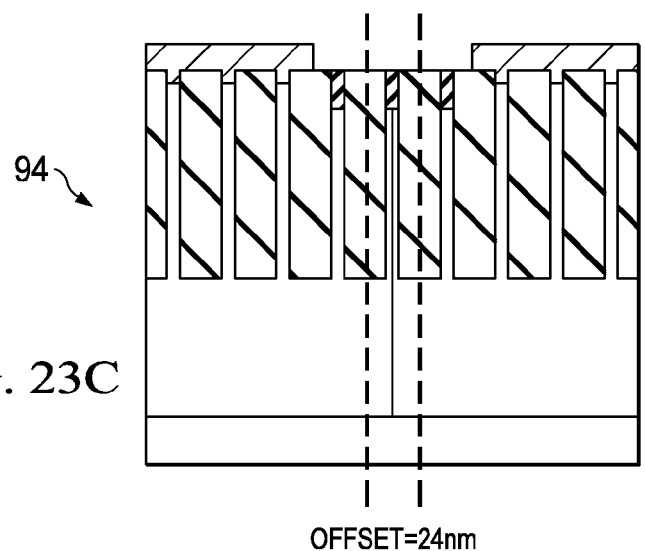
Figure 23D:
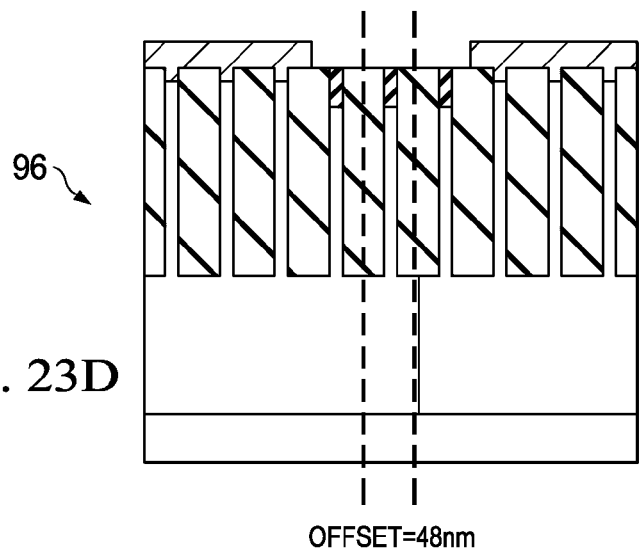

Referring now to FIG. 23A, a chart 90 illustrating the leakage current relative to various junction offsets 92, 94, 96, as depicted in FIGS. 23B-23D, is provided. As shown, if the embodiment FinFET is designed such that the n-well/p-well interface occurs within the fin space region, then the isolation efficiency is comparable to, or as good as, the isolation efficiency of the conventional FinFET. Moreover, even if the interface is inside the fin region, the leakage current is smaller than the counterpart of the planar structure with the same initial isolation depth (i.e., the junction is inside a very narrow region, which is the benefit of the FinFET structure).

Figure 24:
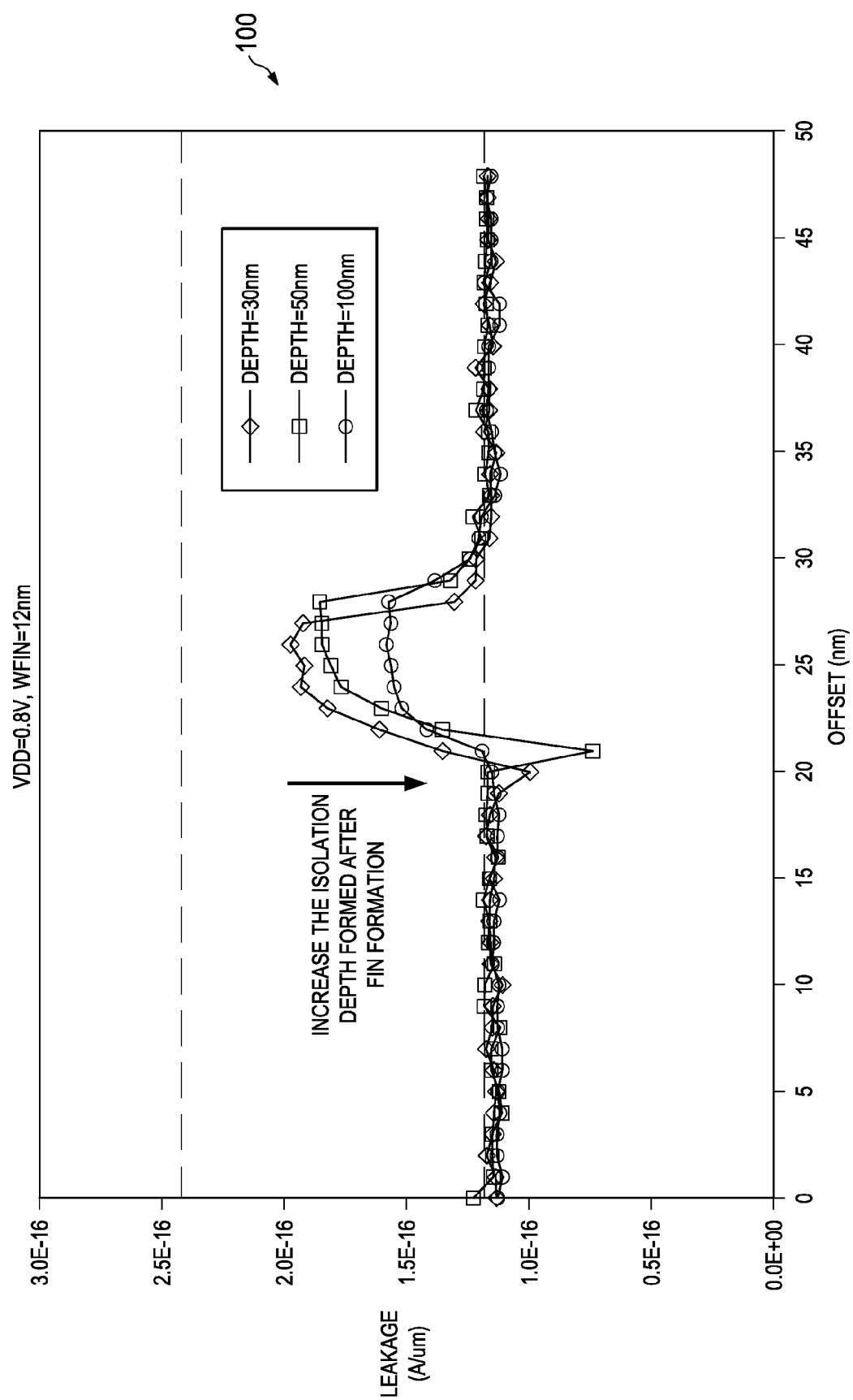
FIG. 24 another chart illustrating a leakage current relative to offset distances.

Referring now to FIG. 24, a chart 100 illustrating the leakage current relative to the offset distance is provided. As shown, a deeper isolation trench generally corresponds to a more efficient suppression of the reverse bias junction leakage.

It should be recognized that additional processing steps not pertinent to the inventive concept may have been omitted from the overall fabrication process for brevity. For example, a detailed explanation of the formation of source/drain regions in the FinFET 10, the isolation along the end-cut direction (or determination of the line-end-cut), the middle end of line (MEOL) formation (Salicide/M0/MP), and the back end of line (BEOL) formation (M1/V0) have not been included. In addition, in practical applications additional or intervening steps may be employed in forming the FinFET 10.

From the foregoing, it should be recognized that the embodiment FinFET 10 provides numerous advantages. For example, the environment between fins, including the inner, outer, and isolation fins, is equivalent. In addition, the pattern density and the process environment for etching, cleaning, and spin-on dielectric (SOD) curing are the same. As alluded to above, there is little or no fin bending or deformation of the outermost fins after spin-on dielectric (SOD) curing, even with a higher process temperature. In addition, electrical mismatches are reduced.

In addition, the above process provides for uniform fin width between inner and outer fins after the etching and cleaning steps. Moreover, the FinFET 10 has a more uniform turn-on (better electrical characteristic) between inner and outer fins. Further, the FinFET 10 has a simplified SPICE model that does not need to model layout effect, which is easier for circuit designers. Still further, the FinFET may be fabricated with an improved yield. For example, pitch variation is improved (well enclosure/space to fin, gate polysilicon endcap spacing, source/drain epitaxy merger) and the design rules are loosened (smaller layout area).

An embodiment fin field-effect transistor (FinFET) includes an inner fin, and outer fin spaced apart from the inner fin by a shallow trench isolation (STI) region, an isolation fin spaced apart from the outer fin by the STI region, the isolation fin including a body portion, an isolation oxide, and an etch stop layer, the etch stop layer interposed between the body portion and the isolation oxide and between the STI region and the isolation oxide, and a gate formed over the inner fin, the outer fin, and the isolation fin.

An embodiment fin field-effect transistor (FinFET) includes a first group of fins supported by a semiconductor substrate and having a first doping type, the first group of fins including a first outermost active fin disposed inwardly of a first isolation fin, the first isolation fin including a first portion of an etch stop layer extending along sidewalls and a bottom surface of an isolation oxide supported by a first body portion of the first isolation fin, a second group of fins supported by the semiconductor substrate and having a second doping type, the second group of fins including a second outermost active fin disposed inwardly of a second isolation fin, the second isolation fin including a second portion of the etch stop layer extending along the sidewalls and the bottom surface of the isolation oxide supported by a second body portion of the second isolation fin, and a gate formed over the first group of fins and the second group of fins.

An embodiment method of forming a fin field-effect transistor (FinFET) using an isolation last technique includes removing a pad oxide layer from a fin extending above a shallow trench isolation (STI) region, recessing the fin to form a body portion within the STI region, removing a hard mask protecting active fins adjacent to the body portion, depositing an etch stop layer over the pad oxide layer on the active fins, along sidewalls of the STI region above the body portion, and on a top surface of the body portion, depositing an isolation oxide over the etch stop layer, planarizing the isolation oxide until reaching the etch stop layer on a top surface of the active fins, etching away the isolation oxide until reaching the etch stop layer disposed on a top surface of the STI region, the isolation oxide below the etch stop layer, the etch stop layer along sidewalls of the STI region, and the body portion forming an isolation fin, removing the etch stop layer and the pad oxide layer disposed over the top surface of the STI region and the active fins, and forming a gate over the active fins and the isolation fin.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A fin field-effect transistor (FinFET), comprising:
   a first well of a first conductivity type;
   a second well of a second conductivity type, the first conductivity type being different than the second conductivity type, the first well and the second well forming a p-n junction;
   an inner fin;
   an outer fin spaced apart from the inner fin by a first shallow trench isolation (STI) region;
   a first isolation fin spaced apart from the outer fin by a second STI region, the first isolation fin including a first body portion, a first isolation oxide over a top surface of the first body portion, and a first etch stop layer, the first etch stop layer interposed between the first body portion and the first isolation oxide and between the second STI region and the first isolation oxide, the first isolation fin being interposed between the p-n junction and the outer fin;
   a second isolation fin spaced apart from the first isolation fin by a third STI region, the second isolation fin including a second body portion, a second isolation oxide over the second body portion, and a second etch stop layer, the second etch stop layer interposed between the second body portion and the second isolation oxide and between the third STI region and the second isolation oxide, no active fin being interposed between the first isolation fin and the second isolation fin, the p-n junction being interposed between the first isolation fin and the second isolation fin; and
   a gate over the inner fin, the outer fin, the first isolation fin and the second isolation fin.

2. The FinFET of claim 1, wherein the first etch stop layer is disposed on sidewalls and a bottom surface of the first isolation oxide.

3. The FinFET of claim 1, wherein the first etch stop layer is disposed on sidewalls of the second STI region.

4. The FinFET of claim 1, wherein the first etch stop layer is disposed on a top surface of the first body portion of the first isolation fin.

5. The FinFET of claim 1, wherein a height of the first isolation fin is less than a height of the outer fin.

6. The FinFET of claim 1, wherein a height of the first isolation fin is less than a height of each of the inner fin and the outer fin.

7. The FinFET of claim 1, wherein a top surface of the first isolation oxide adjoins a bottom surface of the gate.

8. The FinFET of claim 1, wherein the inner fin and the outer fin are disposed within an active region and the first isolation fin is disposed outside the active region.

9. The FinFET of claim 1, wherein the first etch stop layer comprises silicon nitride.

10. The FinFET of claim 1, wherein the second isolation fin having a different doping type than the first isolation fin.

11. The FinFET of claim 1, wherein the first STI region, the second STI region and the third STI region are regions of a single continuous STI.

12. A fin field-effect transistor (FinFET), comprising:
    a first group of fins supported by a semiconductor substrate and having a first doping type, the first group of fins including a first outermost active fin and a first isolation fin, the first isolation fin including a first etch stop layer extending along sidewalls and a bottom surface of a first isolation oxide supported by a first body portion of the first isolation fin;
    a second group of fins supported by the semiconductor substrate and having a second doping type, the second group of fins including a second outermost active fin and a second isolation fin, the second isolation fin including a second etch stop layer extending along sidewalls and a bottom surface of a second isolation oxide supported by a second body portion of the second isolation fin, the first doping type being different than the second doping type, no active fin being interposed between the first isolation fin and the second isolation fin; and
    a gate over the first group of fins and the second group of fins.

13. The FinFET of claim 12, wherein the first etch stop layer and the second etch stop layer each extend along sidewalls of a shallow trench isolation (STI) region disposed horizontally adjacent to the first isolation oxide and the second isolation oxide.

14. The FinFET of claim 13, wherein a top surface of the first isolation fin, a top surface of the second isolation fin, and a top surface of the STI region are co-planar.

15. The FinFET of claim 13, wherein the STI region separates the first outermost active fin from the first isolation fin and the second outermost active fin from the second isolation fin.

16. The FinFET of claim 12, wherein the first isolation oxide is encapsulated by the first etch stop layer and a bottom surface of the gate, and the second isolation oxide is encapsulated by the second etch stop layer and the bottom surface of the gate.

17. A semiconductor device comprising:
    an active fin in a first well in a substrate, the active fin being a closest active fin in the first well to a p-n junction;
    an isolation fin on the substrate and adjacent to the active fin, the isolation fin being interposed between the active fin and the p-n junction, the isolation fin comprising an etch stop layer over a body portion and an isolation oxide over the etch stop layer;
    a shallow trench isolation (STI) region over the substrate, the STI region interposed between the active fin and the isolation fin, the STI region and the isolation fin extending a first distance from the substrate; and
    a gate over the active fin.

18. The semiconductor device of claim 17, wherein the etch stop layer adjoins a sidewall and a bottom surface of the isolation oxide, and wherein a bottom surface of the gate adjoins a top surface of the isolation oxide.

19. The semiconductor device of claim 17, wherein the active fin extends a second distance from the substrate, the second distance being greater than the first distance.

20. The semiconductor device of claim 17, wherein the etch stop layer comprises silicon nitride.

* * * * *